(12) United States Patent
Cheng

(10) Patent No.: US 11,114,478 B2
(45) Date of Patent: Sep. 7, 2021

(54) THIN FILM TRANSISTOR AND MANUFACTURE METHOD THEREOF, ARRAY SUBSTRATE AND MANUFACTURE METHOD THEREOF

(71) Applicants: Hefei Xinsheng Optoelectronics Technology Co., Ltd., Anhui (CN); BOE Technology Group Co., Ltd., Beijing (CN)

(72) Inventor: Leilei Cheng, Beijing (CN)

(73) Assignees: Hefei Xinsheng Optoelectronics Technology Co., Ltd., Anhui (CN); BOE Technology Group Co., Ltd., Beijing (CN)

(*) Notice: Subject to any disclaimer, the term of this patent is extended or adjusted under 35 U.S.C. 154(b) by 0 days.

(21) Appl. No.: 16/561,315

(22) Filed: Sep. 5, 2019

(65) Prior Publication Data

US 2020/0144312 A1    May 7, 2020

(30) Foreign Application Priority Data

Nov. 1, 2018 (CN) .......................... 201811294774.4

(51) Int. Cl.
*H01L 27/12* (2006.01)
*H01L 21/308* (2006.01)
(Continued)

(52) U.S. Cl.
CPC ...... *H01L 27/1288* (2013.01); *H01L 21/3086* (2013.01); *H01L 27/124* (2013.01); *H01L 29/66742* (2013.01); *H01L 29/78633* (2013.01)

(58) Field of Classification Search
CPC ............ H01L 21/285; H01L 21/28506; H01L 21/28512; H01L 21/2855; H01L 21/28556; H01L 21/28562; H01L 21/28568; H01L 21/28575; H01L 21/28587; H01L 29/401; H01L 29/41733; H01L 29/458; H01L 29/66742–6678; H01L 29/786; H01L 29/78651–78678; H01L 29/78681; H01L 29/78684; H01L 29/7869; H01L 29/78693; H01L 29/78696
See application file for complete search history.

(56) References Cited

U.S. PATENT DOCUMENTS 10,923,506 B2 *  2/2021  Park .................... H01L 27/1218
2007/0108446 A1 *  5/2007  Akimoto ........... H01L 29/78621
257/61

(Continued)

*Primary Examiner* — Scott B Geyer
(74) *Attorney, Agent, or Firm* — Banner & Witcoff, Ltd.

(57) ABSTRACT

A thin film transistor and a manufacture method thereof, an array substrate and a manufacture method thereof are provided. The manufacture method of the thin film transistor includes: providing a base substrate; and forming a gate electrode, a first electrode, a second electrode and a semiconductor layer of the thin film transistor on the base substrate. At least one of the gate electrode, the first electrode and the second electrode includes N portions that are stacked in a direction perpendicular to the base substrate, adjacent two of the N portions are in direct contact with each other, and N is a positive integer more than or equal to 2. The method includes: performing N patterning processes to respectively form the N portions.

19 Claims, 14 Drawing Sheets

(51) Int. Cl.
  *H01L 29/66* (2006.01)
  *H01L 29/786* (2006.01)

(56) References Cited

U.S. PATENT DOCUMENTS

| | | | |
|---|---|---|---|
| 2014/0001640 A1* | 1/2014 | Nishizawa | H01L 29/475 |
| | | | 257/773 |
| 2014/0167061 A1* | 6/2014 | Oka | H01L 29/45 |
| | | | 257/76 |
| 2015/0311084 A1* | 10/2015 | Moore | H01L 29/401 |
| | | | 257/280 |
| 2019/0115369 A1* | 4/2019 | Lee | H01L 21/2855 |

* cited by examiner

US 11,114,478 B2

THIN FILM TRANSISTOR AND MANUFACTURE METHOD THEREOF, ARRAY SUBSTRATE AND MANUFACTURE METHOD THEREOF

CROSS REFERENCE TO RELATED APPLICATIONS

The present application claims priority of Chinese Patent Application No. 201811294774.4 filed on Nov. 1, 2018, the disclosure of which is incorporated herein by reference in its entirety as part of the present application.

TECHNICAL FIELD

At least one embodiment of the present disclosure relates to a thin film transistor and a manufacture method thereof, an array substrate and a manufacture method thereof.

BACKGROUND

With increasing requirements for products, technology developments of high-precision display technologies, such as an 8 k (resolution 7680×4320) display technology, is particularly important. In high-precision displays such as an 8 k display, wires of a large arrangement density is required, but signal crosstalk and a short circuit are easily generated between adjacent wires, which affects signal transmission. In a case where the wire is required to have a small resistance to increase a current in the wire and increase a signal transmission speed, for example, a thickness of the wire is increased to reduce the resistance of the wire. In a case where the wire is thick, in a process of forming the wire, a dimensional error of the wire is large, which increases a risk of the signal crosstalk and the short circuit generated between the adjacent wires.

SUMMARY

At least one embodiment of the present disclosure provides a thin film transistor, and the thin film transistor comprises: a gate electrode, a first electrode, a second electrode and a semiconductor layer. The first electrode and the second electrode are electrically connected to the semiconductor layer, at least one of a group consisting of the gate electrode, the first electrode and the second electrode comprises N portions that are stacked, adjacent two portions of the N portions are in direct contact with each other, and N is a positive integer more than or equal to 2

For example, in the thin film transistor provided by at least one embodiment of the present disclosure, the semiconductor layer comprises an upper surface, a first side surface and a second side surface that intersect the upper surface, and the first side surface is opposite to the second side surface. The first electrode is in direct contact with the upper surface and the first side surface, and the second electrode is in direct contact with the upper surface and the second side surface For example, the thin film transistor provided by at least one embodiment of the present disclosure is disposed on a base substrate, the thin film transistor further comprises a gate insulating layer, and the gate insulating layer comprises a first portion, a second portion, and a third portion. The first portion is between the gate electrode and the semiconductor layer, so as to insulate the gate electrode and the semiconductor layer, the first portion exposes the upper surface, which surface is used for contact with the first electrode and the second electrode, of the semiconductor layer, exposes the first side surface, which surface is used for contact with the first electrode, of the semiconductor layer, and exposes the second side surface, which surface is used for contact with the second electrode, of the semiconductor layer. The second portion is between the first electrode and the base substrate; and the third portion is between the second electrode and the base substrate.

At least one embodiment of the present disclosure provides a manufacture method of a thin film transistor, comprising: providing a base substrate; and forming a gate electrode, a first electrode, a second electrode and a semiconductor layer of the thin film transistor on the base substrate, wherein at least one of a group consisting of the gate electrode, the first electrode and the second electrode comprises N portions that are stacked in a direction perpendicular to the base substrate, adjacent two portions of the N portions are in direct contact with each other, and N is a positive integer more than or equal to 2. The method comprises: performing N patterning processes to respectively form the N portions.

For example, in the manufacture method of a thin film transistor provided by at least one embodiment of the present disclosure, a total thickness of the N portions in the direction perpendicular to the base substrate is more than 5500 angstroms, and a thickness in the direction perpendicular to the base substrate of each portion of the N portions is not more than 5500 angstroms.

For example, in the manufacture method of a thin film transistor provided by at least one embodiment of the present disclosure, a same mask is used to perform the N patterning processes.

For example, in the manufacture method of a thin film transistor provided by at least one embodiment of the present disclosure, the gate electrode comprises $N_1$ portions that are stacked in the direction perpendicular to the base substrate, the first electrode comprises $N_2$ portions that are stacked in the direction perpendicular to the base substrate, and the second electrode comprises $N_3$ portions that are stacked in the direction perpendicular to the base substrate; $N_1$, $N_2$, and $N_3$ are all positive integers more than or equal to 2. In a direction from a position close to the base substrate to a position away from the base substrate, the $N_1$ portions are sequentially a first portion, a second portion . . . , and a $N_1$-th portion, the $N_2$ portions are sequentially a first portion, a second portion . . . , and a $N_2$-th portion, and the $N_3$ portions are sequentially a first portion, a second portion . . . , and a $N_3$-th portion. A $M_1$-th portion of the gate electrode, a $M_2$-th portion of the first electrode and a $M_3$-th portion of the second electrode are simultaneously formed by one patterning process using a same mask; $M_1$ is a positive integer less than or equal to $N_1$, $M_2$ is a positive integer less than or equal to $N_2$, and $M_3$ is a positive integer less than or equal to $N_3$.

For example, in the manufacture method of a thin film transistor provided by at least one embodiment of the present disclosure, $N_1=N_2=N_3$, $M_1=M_2=M_3$.

For example, in the manufacture method of a thin film transistor provided by at least one embodiment of the present disclosure, the semiconductor layer comprises an upper surface away from the base substrate, a first side surface and a second side surface that intersect the upper surface, and the first side surface is opposite to the second side surface; the first electrode is in direct contact with the upper surface and the first side surface, and the second electrode is in direct contact with the upper surface and the second side surface.

For example, the manufacture method of a thin film transistor provided by at least one embodiment of the present disclosure further comprises: forming a gate insulating layer. The gate insulating layer comprises: a first portion, a second portion, and a third portion. The first portion is between the gate electrode and the semiconductor layer so as to insulate the gate electrode and the semiconductor layer, the first portion exposes the upper surface, which surface is used for contact with the first electrode and the second electrode, of the semiconductor layer, exposes the first side surface, which surface is used for contact with the first electrode, of the semiconductor layer, and exposes the second side surface, which surface is used for contact with the second electrode, of the semiconductor layer for. The second portion is between the first electrode and the base substrate; and the third portion is between the second electrode and the base substrate.

For example, in the manufacture method of a thin film transistor provided by at least one embodiment of the present disclosure, forming the gate insulating layer comprises: forming a gate insulating material film; forming a photoresist layer covering the gate insulating material film; exposing and developing the photoresist layer using a two-tone mask to obtain a photoresist remaining region, a photoresist partially remaining region, and a photoresist removing region, wherein the photoresist remaining region is a region where the first portion of the gate insulating layer is to be formed, the photoresist partially remaining region is a region where the second portion and the third portion of the gate insulating layer are to be formed, and the photoresist removing region is a region except the photoresist remaining region and the photoresist partially remaining region; performing a first etching process to remove a portion of the gate insulating material film in the photoresist removing region; performing an ashing process to remove a portion of the photoresist layer in the photoresist partially remaining region and thin a portion of the photoresist layer in the photoresist remaining region; performing a second etching process to thin a portion of the gate insulating material film in the photoresist partially remaining region, so as to form the first portion, the second portion, and the third portion of the gate insulating layer; and removing a portion of the photoresist layer in the photoresist remaining region.

At least one embodiment of the present disclosure provides a manufacture method of an array substrate, the method comprises: forming the thin film transistor by any one of the manufacture methods of a thin film transistor provided by the embodiments of the present disclosure.

For example, the manufacture method of the array substrate provided by at least one embodiment of the present disclosure further comprises: forming a signal line on the base substrate, wherein the signal line comprises $N_4$ portions that are stacked in a direction perpendicular to the base substrate, adjacent two portions of the $N_4$ portions are in direct contact with each other, and $N_4$ is a positive integer more than or equal to 2. Forming the signal line comprises: performing $N_4$ patterning processes to respectively form the $N_4$ portions.

For example, in the manufacture method of the array substrate provided by at least one embodiment of the present disclosure, a total thickness of the signal line in the direction perpendicular to the base substrate is more than 5500 angstroms, and a thickness in the direction perpendicular to the base substrate of each portion of the $N_4$ portions is not more than 5500 angstroms in the direction perpendicular to the base substrate.

For example, in the manufacture method of the array substrate provided by at least one embodiment of the present disclosure, the array substrate comprises a plurality of the signal lines extending in a same direction, and an interval between adjacent signal lines of the plurality of the signal lines is less than or equal to 6 μm.

For example, in the manufacture method of the array substrate provided by at least one embodiment of the present disclosure, a same mask is used to perform the $N_4$ patterning processes.

For example, in the manufacture method of the array substrate provided by at least one embodiment of the present disclosure, the gate electrode comprises $N_1$ portions that are stacked in the direction perpendicular to the base substrate, the first electrode comprises $N_2$ portions that are stacked in the direction perpendicular to the base substrate, and the second electrode comprises $N_3$ portions that are stacked in the direction perpendicular to the base substrate; $N_1$, $N_2$, and $N_3$ are all positive integers more than or equal to 2. In a direction from a position close to the base substrate to a position away from the base substrate, the $N_4$ portions of the signal line are sequentially a first portion, a second portion . . . , and a $N_4$-th portion, the $N_1$ portions of the gate electrode are sequentially a first portion, a second portion . . . , and a $N_1$-th portion, the $N_2$ portions of the first electrode are sequentially a first portion, a second portion . . . , and a $N_2$-th portion, and the $N_3$ portions of the second electrode are sequentially a first portion, a second portion . . . , and a $N_3$-th portion. A $M_4$-th portion of the signal line, a $M_1$-th portion of the gate electrode, a $M_2$-th portion of the first electrode and a $M_3$-th portion of the second electrode are simultaneously formed by one patterning process using a same mask; $M_1$ is a positive integer less than or equal to $N_1$, $M_2$ is a positive integer less than or equal to $N_2$, $M_3$ is a positive integer less than or equal to $N_3$, and $M_4$ is a positive integer less than or equal to $N_4$.

For example, in the manufacture method of the array substrate provided by at least one embodiment of the present disclosure, the signal line comprises at least one of a group consisting of a gate line electrically connected to the gate electrode, a data line electrically connected to the second electrode, a common voltage line providing a common voltage, and a ground line.

For example, in the manufacture method of the array substrate provided by at least one embodiment of the present disclosure, the data line intersects with and is insulated from the gate line; and the manufacture method comprises: forming the gate line, the gate electrode, the first electrode and the second electrode simultaneously by a same patterning process; forming an interlayer insulating layer covering the gate line, the gate electrode, the first electrode, and the second electrode, wherein the interlayer insulating layer comprises a via hole exposing the second electrode; and forming the data line on the interlayer insulating layer, and the data line is electrically connected to the second electrode through the via hole.

For example, the manufacture method of the array substrate provided by at least one embodiment of the present disclosure further comprises: forming a light shielding layer, wherein the light shielding layer is on a side, which side is away from the gate electrode, of the semiconductor layer, and an orthographic projection of the light shielding layer on the base substrate at least partially overlaps an orthographic projection of a channel region of the semiconductor layer of the thin film transistor on the base substrate. The common voltage line or the ground line is electrically connected to the light shielding layer.

At least one embodiment of the present disclosure provides an array substrate, and the array substrate is formed by any one of the manufacture methods of the array substrate provided by the embodiments of the present disclosure.

BRIEF DESCRIPTION OF THE DRAWINGS

In order to demonstrate clearly technical solutions of the embodiments of the present disclosure, the accompanying drawings in relevant embodiments of the present disclosure will be introduced briefly. It is apparent that the drawings may only relate to some embodiments of the disclosure and not intended to limit the present disclosure.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is apparent that the described embodiments are just a part but not all of the embodiments of the disclosure. Based on the described embodiments herein, those skilled in the art may obtain other embodiment, without any creative work, which shall be within the scope of the disclosure.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present disclosure, are not intended to indicate any sequence, amount or importance, but for distinguishing various components. The terms, such as "comprise/comprising," "comprise/comprising," or the like are intended to specify that the elements or the objects stated before these terms encompass the elements or the objects and equivalents thereof listed after these terms, but not preclude other elements or objects. The terms, such as "connect/connecting/connected," "couple/coupling/coupled" or the like, are not limited to a physical connection or mechanical connection, but may comprise an electrical connection/coupling, directly or indirectly. The terms, "inside," "outside," "on," "under," "left," "right," or the like are only used to indicate relative position relationship, and when the position of the object which is described is changed, the relative position relationship may be changed accordingly.

The drawings used in the present disclosure are not strictly drawn according to the actual scales, and specific dimensions and a total number of each structure can be determined according to actual needs. The drawings described in the present disclosure are merely structural schematic diagrams.

It should be noted that, in the present disclosure, adjacent two portions of the N portions being in direct contact with each other refers to that in the direction perpendicular to the base substrate, no other layer or structure is between the adjacent two portions of the N portions.

It should be noted that, in the present disclosure, the term "A is in direct contact with B" or the like refers to that the A is in a face-to-face contact with the B, and there is no other layer or structure between the A and the B, which is different from the case where the A is contact with the B by a via hole or a wire, or the like. The A and the B are structures or surfaces in the embodiment of the present disclosure.

In addition, in the present disclosure, "N" of the term "performing N patterning processes" refers to N times.

Figure 1A:
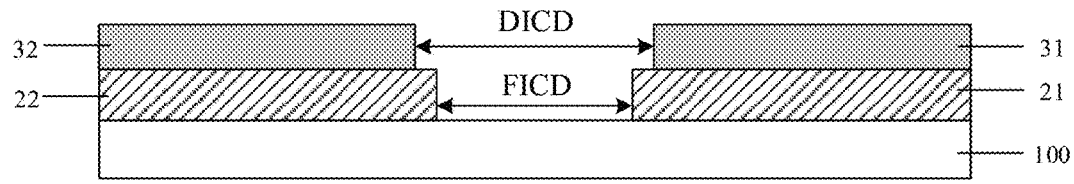
FIG. 1A is a schematic diagram of a critical dimension bias in a photolithography process.

FIG. 1A is a schematic diagram of a critical dimension (CD) bias in a photolithography process. As illustrated in FIG. 1A, a pattern of a film layer is formed on a base substrate 100 by a patterning process. Taking a formation of metal structures that are spaced apart from each other as an example. A conductive structure 21 and a conductive structure 22 are adjacent conductive structures, and a predetermined interval is between the conductive structure 21 and the conductive structure 22. For example, a metal film layer is first formed, and then a photoresist is formed on the metal film layer, and the conductive structure 21 and the conductive structure 22 are formed by patterning the metal film layer by a photolithography process using a mask and the photoresist formed on the metal film layer, for example, then the conductive structure 21 and the conductive structure 22 are formed successively by an exposure process, a development process and an etching process. Development inspection critical dimension (Development Inspection CD) generally refers to a distance DICD between the formed adjacent photoresist patterns 31 and 32. Final inspection critical dimension (Final Inspection CD) generally refers to a distance FICD between the adjacent conductive structures 21 and 22 after the etching process is completed. The critical dimension bias (CD Bias) is an absolute value of a difference between DICD and FICD, that is, CD Bias=|DICD−FICD|. In addition, in the process of the exposure using the mask, there is an overlap bias (OL) of the mask. In a case where a sum of the CD Bias and the OL is more than or close to the distance FICD between the adjacent conductive structures 21 and the conductive structures 22, signal crosstalk and a short circuit are easily generated between the adjacent conductive structures 21 and 22, which affects a transmission of signals. Therefore, the smaller the CD Bias and the OL, the better, and the higher the etching accuracy, the better. However, in a case where a thickness in a direction perpendicular to the base substrate 100 of the conductive structure 21 and a thickness in the direction perpendicular to the base substrate 100 of the conductive structure 22 are large (for example, in a case where the wire is required to have a small resistance to increase the current in the wire and increase the signal transmission speed, the thickness of the wire is increased to reduce the resistance of the wire), the etching accuracy of the conductive structure is lowered, the CD Bias is increased, and the signal crosstalk and the short circuit are easily generated between the adjacent conductive structures. For example, the adjacent conductive structures 21 and 22 may be electrodes, wires, or the like.

At least one embodiment of the present disclosure provides a thin film transistor, and the thin film transistor comprises: a gate electrode, a first electrode, a second electrode and a semiconductor layer. The first electrode and the second electrode are electrically connected to the semiconductor layer, at least one of a group consisting of the gate electrode, the first electrode and the second electrode comprises N portions that are stacked, adjacent two portions of the N portions are in direct contact with each other, and N is a positive integer more than or equal to 2.

In some cases, it is required that the gate electrode, the first electrode, and the second electrode of the thin film transistor have large thicknesses in the direction perpendicular to the base substrate. For example, in the display substrate, in order to achieve a better display effect, a high resolution is required, in this case, the thicknesses of the above structures are increased to reduce the resistances of the above structures, so as to increase the signal transmission speed, a response time, and so on of the thin film transistor. In addition, an arrangement density of the thin film transistor is large, if a dimensional error of the electrodes of the thin film transistor is large, a distance between adjacent electrodes is too small, thereby causing a signal interference and a short circuit generated between the adjacent electrodes. In a case where a thickness of at least one of a group consisting of the gate electrode, the first electrode and the second electrode is large, in the process of forming the gate electrode, the first electrode or the second electrode by patterning a thick film layer for forming the gate electrode, the first electrode, or the second electrode through a photolithography process, the etching accuracy is lowered, and a uniformity error of the etching is large, so that the dimensional error (for example, the CD Bias mentioned above) of the gate electrode, the first electrode or the second electrode is large, and the error of the interval between the first electrode and the second electrode is large, which causes a problem of the short circuit generated between the first electrode and the second electrode, or increases a risk of the short circuit. In the thin film transistor provided by the embodiment of the present disclosure, at least one of a group consisting of the gate electrode, the first electrode and the second electrode comprises N portions that are stacked, and the N portions may be respectively formed by N patterning processes, so as to reduce a thickness of the film layer (for example, a film layer to be etched) to be patterned in each patterning process, thereby reducing the above-mentioned dimensional error and avoiding the problem that the etching accuracy is lowered and the uniformity error of etching is large.

Figure 1B:
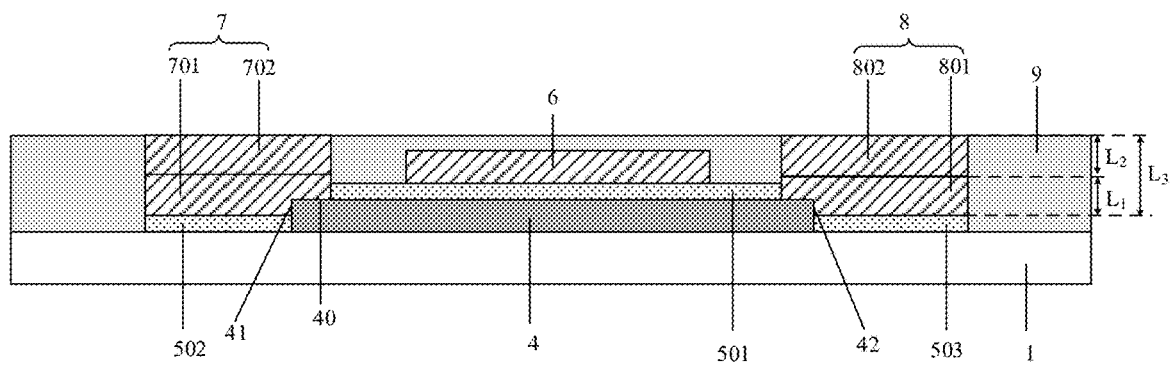
FIG. 1B is a structural schematic diagram of a thin film transistor provided by an embodiment of the present disclosure.

Illustratively, FIG. 1B is a structural schematic diagram of a thin film transistor provided by an embodiment of the present disclosure. FIG. 1B illustrates an example in which the first electrode and the second electrode respectively comprise two portions (N=2) that are stacked. As illustrated in FIG. 1B, for example, the thin film transistor is disposed on a base substrate 1. Of course, there may be other layers between the thin film transistor and the base substrate 1, such as an insulating layer, a planarization layer, or the like, but the layer between the thin film transistor and the base substrate 1 is not limited to the listed species. The thin film transistor provided by an embodiment of the present disclosure comprises a gate electrode 6, a first electrode 7, a second electrode 8 and a semiconductor layer 4. The first electrode 7 and the second electrode 8 are electrically connected to the semiconductor layer 4. The first electrode 7 comprises a first portion 701 and a second portion 702 that are stacked, and the first portion 701 and the second portion 702 are adjacent and in direct contact with each other. The second electrode 8 comprises a first portion 801 and a second portion 802 that are stacked, and the first portion 801 and the second portion 802 are adjacent and in direct contact with each other. For example, the first portion 701 of the first electrode and the second portion 702 of the first electrode are stacked in a direction perpendicular to the base substrate 1, and the first portion 801 of the second electrode and the second portion 802 of the second electrode are stacked in the direction perpendicular to the base substrate 1. A surface, which faces the second portion 702 of the first electrode, of the first portion 701 of the first electrode is in direct contact with a surface, which faces the first portion 701 of the first electrode, of the second portion 702 of the first electrode (adhered to each other). A surface, which faces the second portion 802 of the second electrode, of the first portion 801 of the second electrode is in direct contact with a surface, which faces the first portion 801 of the second electrode, of the second portion 802 of the second electrode (adhered to each other). In this way, for example, the first portion 701 of the first electrode and the first portion 801 of the second electrode are formed by a first patterning process, and then the second portion 702 of the first electrode and the second portion 802 of the second electrode are formed by a second patterning process, thereby reducing the thickness of the film layer (e.g., the film layer to be etched) to be patterned in each patterning process, and reducing the dimensional error in the etching process for the thick film layer, even if the first electrode and the second electrode which have large thicknesses are to be formed, the problems caused by the above-mentioned lowered etching accuracy and increased the uniformity error of the etching are avoided.

For example, an orthographic projection of the first portion 701 of the first electrode on the base substrate 1 coincides with an orthographic projection of the second portion 702 of the first electrode on the base substrate 1. That is, the first portion 701 of the first electrode overlaps the second portion 702 of the first electrode in the direction perpendicular to the base substrate 1, and a planar shape of the first portion 701 of the first electrode is same as a planar shape of the second portion 702 of the first electrode. An orthographic projection of the first portion 801 of the second electrode on the base substrate 1 coincides with an orthographic projection of the second portion 802 of the second electrode on the base substrate 1. That is, the first portion 801 of the second electrode overlaps the second portion 802 of the second electrode in the direction perpendicular to the base substrate 1, that is, a planar shape of the first portion 801 of the second electrode is same as a planar shape of the second portion 802 of the second electrode.

For example, in the direction perpendicular to the base substrate 1, both a thickness $L_1$ of the first portion 701 of the first electrode and a thickness $L_2$ of the second portion 702 of the first electrode are not more than 5500 angstroms, and a sum thickness $L_3$ of the thickness $L_1$ of the first portion 701 of the first electrode 7 and the thickness $L_2$ of the second portion 702 of the first electrode 7 is more than 5500 angstroms. Both a thickness of the first portion 801 of the second electrode 8 and a thickness of the second portion 802 of the second electrode 8 are not more than 5500 angstroms, and a sum thickness of the thickness of the first portion 801 of the second electrode 8 and the thickness of the second portion 802 of the second electrode 8 is more than 5500 angstroms. In a case where a thickness of a film is more than 5500 angstroms, the resulting dimensional error tends to cause a distance between adjacent data lines or adjacent electrodes to be too small, thereby causing the signal interference and the short circuit generated between the adjacent electrodes. In this case, according to the above descriptions, the thin film transistor of the embodiments of the present disclosure still has a small dimensional error, and avoids the signal interference and the short circuit between the adjacent electrodes.

For example, the semiconductor layer 4 comprises an upper surface 40, a first side surface 41 and a second side surface 42 that intersect the upper surface, and the first side surface 41 is opposite to the second side surface 42. The first electrode 7 is in direct contact with the upper surface 40 and the first side surface 41, and the second electrode 8 is in direct contact with the upper surface 40 and the second side surface 42, such that both the first electrode 7 and the second electrode 8 are in direct contact with the semiconductor layer 4, which reduces a contact resistance of the first electrode 7 and the semiconductor layer 4 and reduces a contact resistance of the second electrode 8 and the semiconductor layer 4, compared with a case that the first electrode 7 and the second electrode 8 are electrically connected to the semiconductor layer 4 in an indirect manner such as through via holes and wires. It should be noted that the term "first electrode 7 and the second electrode 8 are in direct contact with the semiconductor layer 4" is different from the case that the first electrode 7 and the second electrode 8 are electrically connected to the semiconductor layer 4 in an indirect manner such as through via holes and wires.

For example, the thin film transistor further comprises a gate insulating layer, and the gate insulating layer comprises: a first portion 501, a second portion 502 and a third portion 503. The first portion 501 of the gate insulating layer is between the gate electrode 6 and the semiconductor layer 4, so as to insulate the gate electrode 6 and the semiconductor layer 4. The first portion 501 of the insulating layer exposes the upper surface 40, which surface is used for contact with the first electrode and the second electrode, of the semiconductor layer 4, exposes the first side surface 41, which surface is used for contact with the first electrode, of the semiconductor layer 4, and exposes the second side surface 42, which surface is used for contact with the second electrode, of the semiconductor layer 4. The second portion 502 of the gate insulating layer is between the first electrode 7 and the base substrate 1, and the third portion 503 of the gate insulating layer is between the second electrode 8 and the base substrate 1. That is, the second portion 502 of the gate insulating layer and the first electrode 7 are stacked in the direction perpendicular to the base substrate 1, and the third portion 503 of the gate insulating layer and the second electrode 8 are stacked in the direction perpendicular to the base substrate 1. Thereby, in the direction perpendicular to the base substrate 1, a height difference between a height of the first electrode 7 and heights of layers above the first electrode 7 is reduced, a height difference between a height of the second electrode 8 and heights of layers above the second electrode 8 is reduced, and a risk of wire breakage generated in a process of depositing a subsequent film layer during a manufacture process of the thin film transistor is reduced.

For example, the gate electrode comprises $N_1$ portions that are stacked in the direction perpendicular to the base substrate, the first electrode comprises $N_2$ portions that are stacked in the direction perpendicular to the base substrate, and the second electrode comprises $N_3$ portions that are stacked in the direction perpendicular to the base substrate, $N_1$, $N_2$, and $N_3$ are positive integers more than or equal to 2.

Figure 1C:
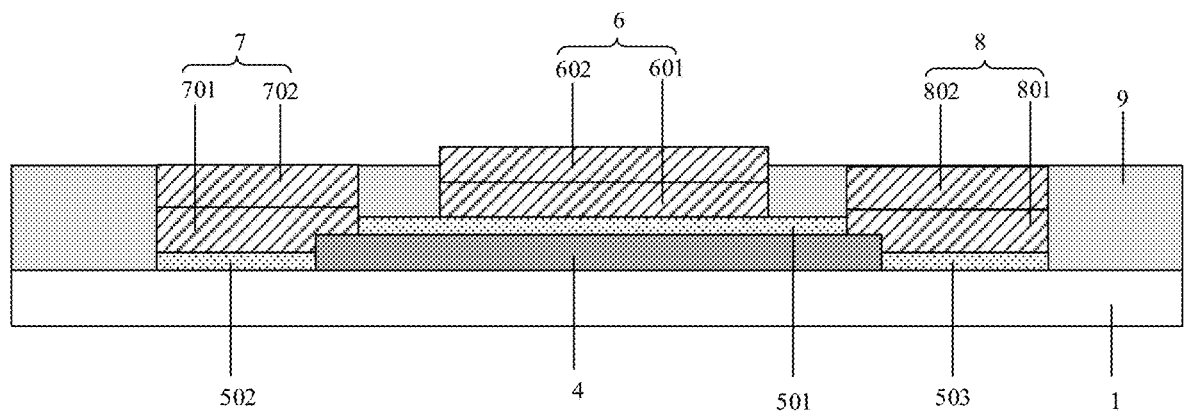
FIG. 1C is a structural schematic diagram of another thin film transistor provided by an embodiment of the present disclosure.

For example, FIG. 1C is a structural schematic diagram of another thin film transistor provided by an embodiment of the present disclosure. As illustrated in FIG. 1C, this embodiment differs from the embodiment illustrated in FIG. 1B in that, in this embodiment, the gate electrode also comprises two portions that are stacked in the direction perpendicular to the base substrate, and this embodiment is illustrated by taking $N_1=N_2=N_3=2$ as an example.

As illustrated in FIG. 1C, the gate electrode 6 comprises a first portion 601 and a second portion 602 that are stacked, the first portion 601 and the second portion 602 of the gate are adjacent and in direct contact with each other. The first electrode 7 comprises a first portion 701 and a second portion 702 that are stacked, and the first portion 701 and the second portion 702 are adjacent and in direct contact with each other. The second electrode 8 comprises a first portion 801 and a second portion 802 that are stacked, and the first portion 801 and the second portion 802 are adjacent and in direct contact with each other. For example, the first portion 601 and the second portion 602 of the gate electrode are stacked in the direction perpendicular to the base substrate 1, that is, a surface, which faces the second portion 602 of the gate electrode, of first portion 601 of the gate electrode is in direct contact with a surface, which faces the first portion 601 of the gate electrode, of the second portion 602 of the gate electrode (adhered to each other). The first portion 701 of the first electrode and the second portion 702 of the first electrode are stacked in the direction perpendicular to the base substrate 1, and the first portion 801 of the second electrode and the second portion 802 of the second electrode are stacked in the direction perpendicular to the base substrate 1. In this way, for example, the first portion 601 of the gate electrode, the first portion 701 of the first electrode and the first portion 801 of the second electrode are formed by a first patterning process, and then the second portion 602 of the gate electrode, the second portion 702 of the first electrode and the second portion 802 of the second electrode are formed by a second patterning process, and thereby reducing the thickness, in the direction perpendicular to the base substrate 1, of the film layer (for example, the film layer to be etched) to be patterned in each patterning process, and reducing the dimensional error in the etching process performed on the thick film layer, even if the gate electrode, the first electrode and the second electrode of large thicknesses are to be formed, the problems caused by the lowered etching accuracy and the large uniformity error of the etching are avoided. Other features and corresponding technical effects of the thin film transistor illustrated in FIG. 1C are the same as those in FIG. 1B, and the features and corresponding effects in the embodiment of FIG. 1C that are not mentioned here can be referred to the above descriptions, and the descriptions are not repeated here.

At least one embodiment of the present disclosure provides a manufacture method of a thin film transistor, and the manufacture method comprises: providing a base substrate; and forming a gate electrode, a first electrode, a second electrode and a semiconductor layer of the thin film transistor on the base substrate. At least one of a group consisting of the gate electrode, the first electrode and the second electrode comprises N portions that are stacked in a direction perpendicular to the base substrate, adjacent two portions of the N portions are in direct contact with each other, and N is a positive integer more than or equal to 2. The method comprises: performing N patterning processes to respectively form the N portions.

Illustratively, FIGS. 2A-2M are schematic diagrams of a manufacture method of a thin film transistor provided by an embodiment of the present disclosure. The embodiment in FIGS. 2A-2M is illustrated by taking the case that the first electrode and the second electrode respectively comprise two portions (N=2) that are stacked in the direction perpendicular to the base substrate for an example.

Figure 2A:
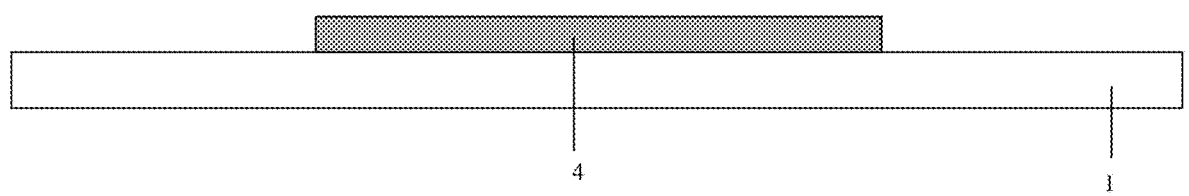
FIGS. 2A-2M are schematic diagrams of a manufacture method of a thin film transistor provided by an embodiment of the present disclosure.

As illustrated in FIG. 2A, a base substrate 1 is provided. For example, the base substrate 1 is a quartz substrate, a glass substrate, or the like. A semiconductor layer 4 of the thin film transistor is formed on the base substrate 1. A specific method for forming the semiconductor layer 4 can be referred to the technique commonly used in the art.

For example, the manufacture method of a thin film transistor further comprises: forming a gate insulating layer. The gate insulating layer comprises: a first portion, a second portion and a third portion. The first portion is between the gate electrode and the semiconductor layer, so as to insulate the gate electrode and the semiconductor layer. The first portion exposes the upper surface, which surface is used for contact with the first electrode and the second electrode, of the semiconductor layer, exposes the first side surface, which surface is used for contact with the first electrode, of the semiconductor layer, and exposes the second side surface, which surface is used for contact with the second electrode, of the semiconductor layer. The second portion is between the first electrode and the base substrate; and the third portion is between the second electrode and the base substrate.

Figure 2B:
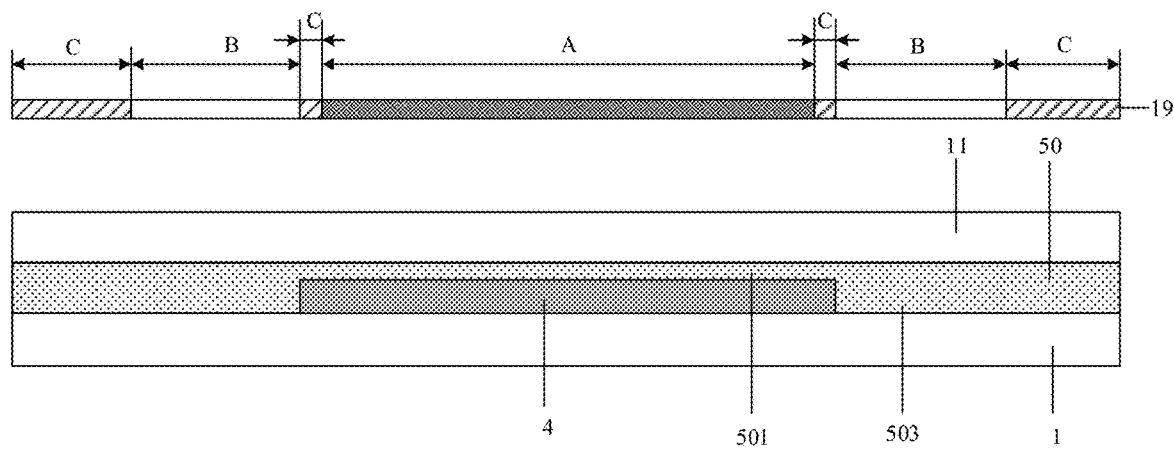

Illustratively, as illustrated in FIG. 2B, for example, forming the gate insulating layer comprises: forming a gate insulating material film 50 covering the gate electrode 4 on the base substrate 1. For example, the material of the gate insulating material film 50 comprises an insulating organic material (such as a resin material or the like) or an insulating inorganic material (such as silicon nitride, silicon oxide, silicon oxynitride, or the like). For example, in a case where the material of the gate insulating material film 50 is an insulating organic material, the gate insulating material film 50 may be formed by a coating method. For example, the material of the gate insulating material film 50 comprises a photosensitive material. For example, the material of the gate insulating material film 50 does not comprise a photosensitive material. In the following, the manufacture method is illustrated taking the case that the material of the gate insulating material film 50 does not comprise a photosensitive material as an example.

Figure 2C:
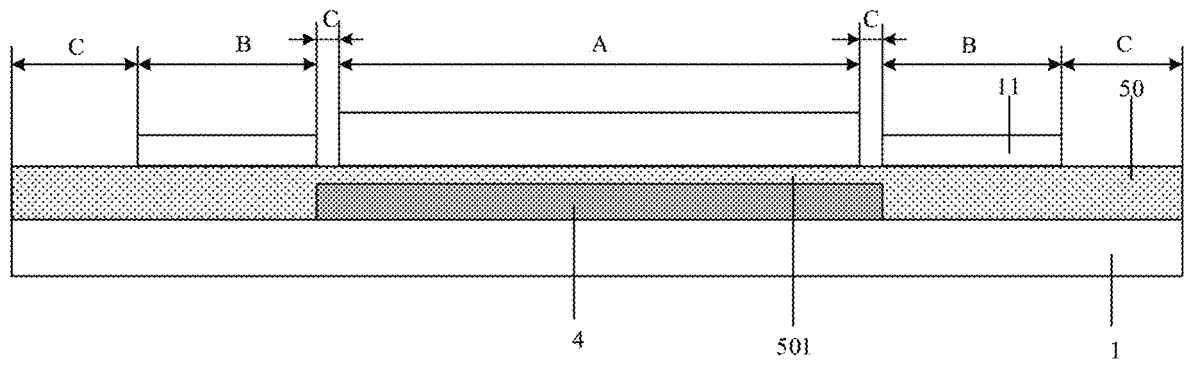

For example, as illustrated in FIGS. 2B and 2C, forming the gate insulating layer further comprises: forming a photoresist layer 11 covering the gate insulating material film 50, and exposing and developing the photoresist layer 11 using a two-tone mask 19. As illustrated in FIG. 2C, a portion of the photoresist layer 11 in a photoresist removing region C is removed and a portion of the photoresist layer 11 in a photoresist partially remaining region B is thinned by development, so as to obtain a photoresist remaining region A, a photoresist partially remaining region B, and a photoresist removing region C. The photoresist remaining region A is a region where the first portion of the gate insulating layer is to be formed subsequently, the photoresist partially remaining region B is a region where the second portion of the gate insulating layer and the third portion of the gate insulating layer are to be formed subsequently, and the photoresist removing region C is a region except the photoresist remaining region and the photoresist partially remaining region.

Figure 2D:
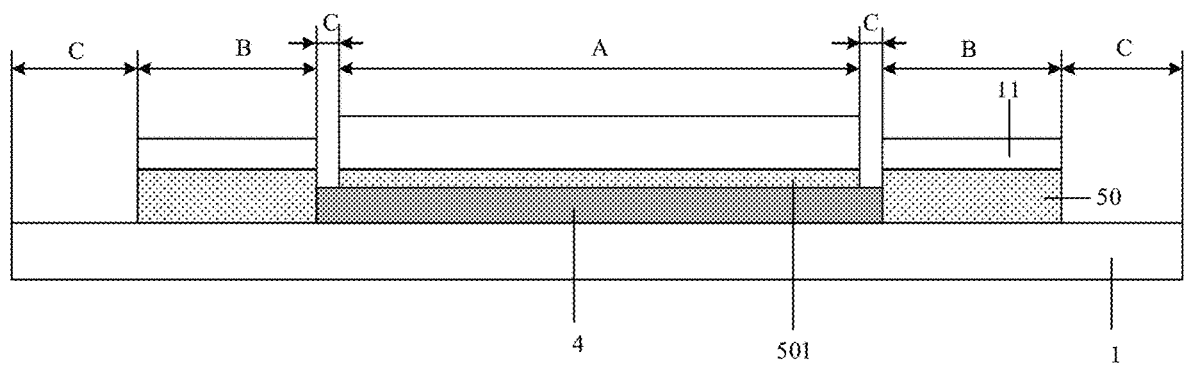

As illustrated in FIG. 2D, a first etching process is performed to remove a portion of the gate insulating material film 50 in the photoresist removing region C. For example, a wet etching process or a dry etching process is adopted.

Figure 2E:
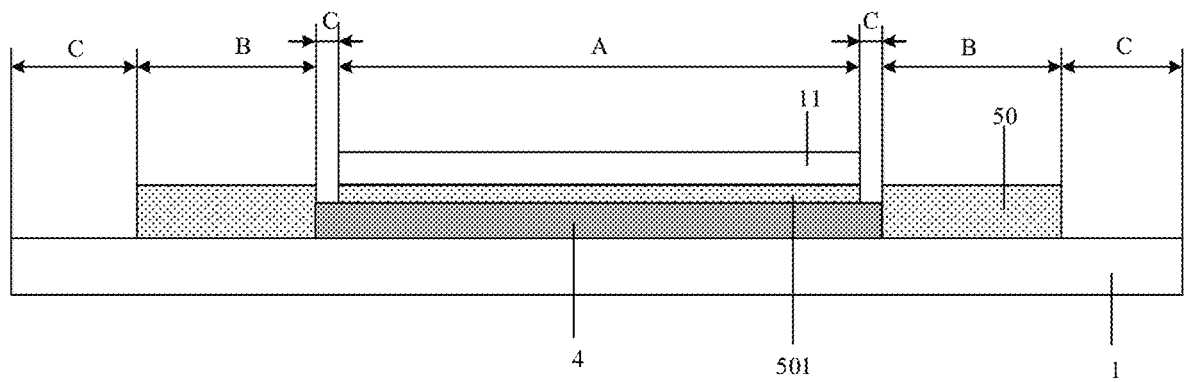

As illustrated in FIG. 2E, an ashing process is performed to remove a portion of the photoresist layer 11 in the photoresist partially remaining region B and thin a portion of the photoresist layer 11 in the photoresist remaining region A.

Figure 2F:
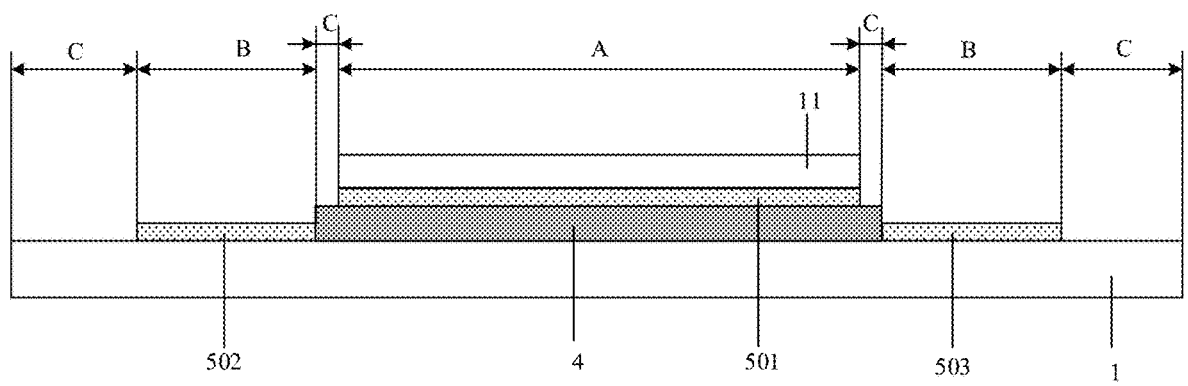

As illustrated in FIG. 2F, a second etching process is performed to thin a portion of the gate insulating material film in the photoresist partially remaining region B, so that the first portion 501 of the gate insulating layer, the second portion 502 of the gate insulating layer and the third portion 503 of the gate insulating layer are formed. The first portion 501 exposes the upper surface 40 of the semiconductor layer 4, in which the upper surface 40 is used for contact with the first electrode and the second electrode, exposes the first side surface 41 of the semiconductor layer 4, in which the first side surface 41 is used for contact with the first electrode, and exposes the second side surface 42 of the semiconductor layer 4, in which the second side surface 42 is used for contact with the second electrode.

Figure 2G:
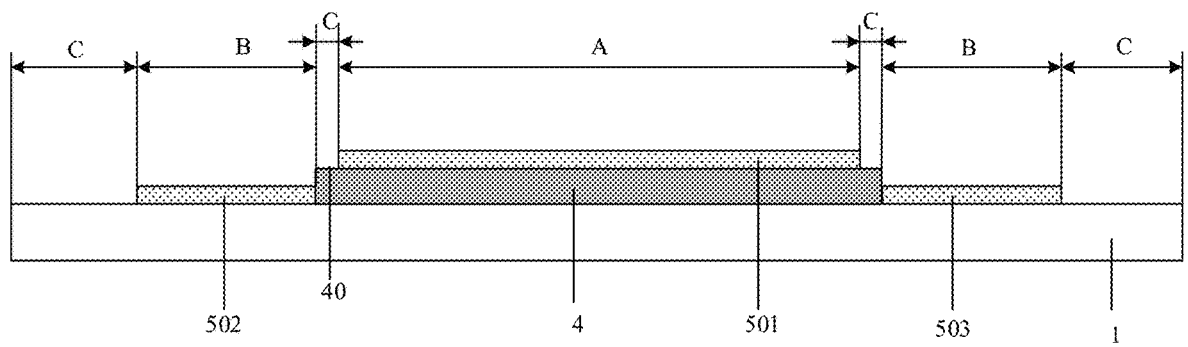

As illustrated in FIG. 2G, a portion of the photoresist layer 11 in the photoresist remaining region A is removed, for example, the portion of the photoresist layer 11 in the photoresist remaining region A is stripped off.

For example, the gate electrode comprises $N_1$ portions that are stacked in the direction perpendicular to the base substrate, the first electrode comprises $N_2$ portions that are stacked in the direction perpendicular to the base substrate, and the second electrode comprises $N_3$ portions that are stacked in the direction perpendicular to the base substrate; $N_1$, $N_2$, and $N_3$ are all positive integers more than or equal to 2. In a direction from a position close to the base substrate to a position away from the base substrate, the $N_1$ portions are sequentially a first portion, a second portion . . . , and a $N_1$-th portion, the $N_2$ portions are sequentially a first portion, a second portion . . . , and a $N_2$-th portion, and the $N_3$ portions are sequentially a first portion, a second portion . . . , and a $N_3$-th portion. Simultaneously forming a $M_1$-th portion of the gate electrode, a $M_2$-th portion of the first electrode, and a $M_3$-th portion of the second electrode by one patterning process using a same mask; $M_1$ is a positive integer less than or equal to $N_1$, $M_2$ is a positive integer less than or equal to $N_2$, and $M_3$ is a positive integer less than or equal to $N_3$.

FIGS. 2A-2M illustrate a manufacture method by taking $N_1=N_2=N_3$, $M_1=M_2=M_3$ as an example.

Figure 2H:
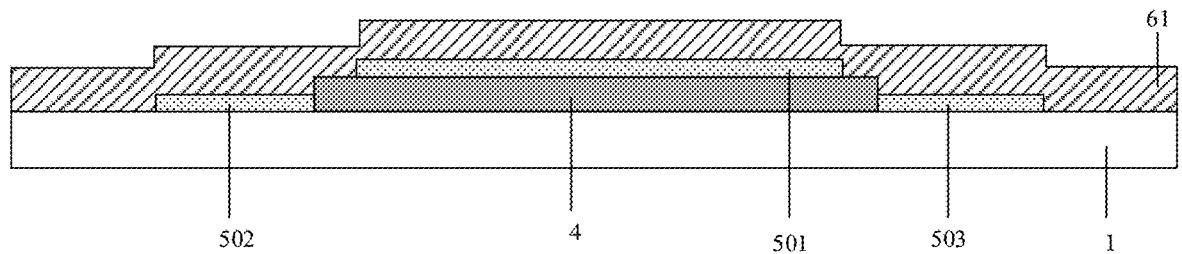

As illustrated in FIG. 2H, a first conductive material film 61 covering the semiconductor layer 4 and the gate insulating layer is formed. The first conductive material film 61 is used to form the gate electrode, the first portion of the first electrode and the first portion of the second electrode. For example, a material of the first conductive material film 61 is a metal material, for example, the metal material comprises at least one of a group consisting of copper, molybdenum, a copper alloy, a molybdenum alloy, a nickel-iron alloy, or the like. For example, the first conductive material film 61 may be formed by a chemical vapor deposition (CVD) method or a magnetron sputtering method.

Figure 2I:
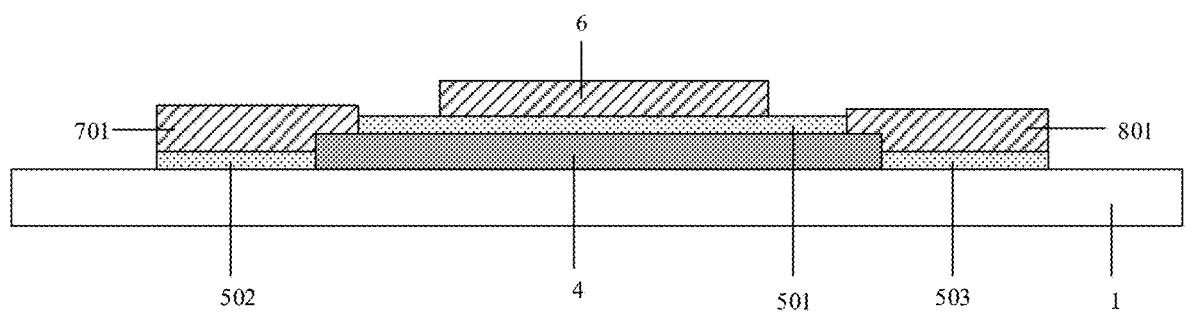

As illustrated in FIG. 2I, the gate electrode 6, the first portion 701 of the first electrode, and the first portion 801 of the second electrode are simultaneously formed by a first patterning process performed on the first conductive material film 61 using a same mask. Thus, the method illustrated in FIG. 2I simplifies the manufacture process compared with a case that the gate electrode 6, the first portion 701 of the first electrode, and the first portion 801 of the second electrode are respectively formed by a plurality of patterning processes.

Figure 2J:
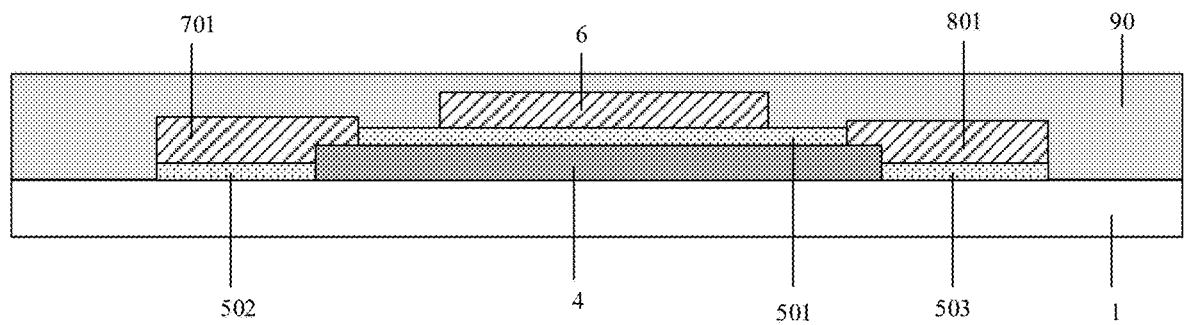

As illustrated in FIG. 2J, a first insulating material film 90 covering the gate electrode 6, the first portion 701 of the first electrode and the first portion 801 of the second electrode is formed. A material of the first insulating material film 90 and a method of forming the first insulating material film 90 can be referred to the above descriptions of the gate insulating material film.

Figure 2K:
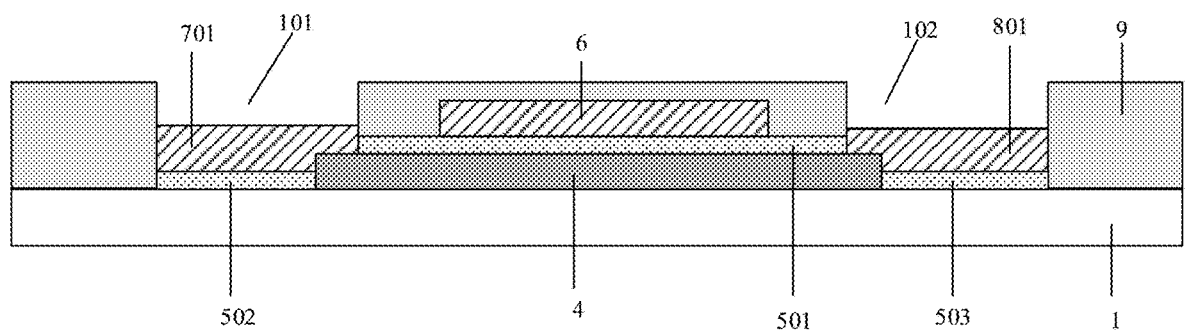

As illustrated in FIG. 2K, the first insulating material film 90 is patterned to form a first insulating layer 9, and the first insulating layer 9 comprises a first via hole 101 exposing the first portion 701 of the first electrode and a second via hole 102 exposing the first portion 801 of the second electrode. For example, the first via hole 101 exposes the entire surface, which surface is away from the base substrate 1, of the first portion 701 of the first electrode, and the second via hole 102 exposes the entire surface, which surface is away from the base substrate 1, of the first portion 801 of the second electrode.

Figure 2L:
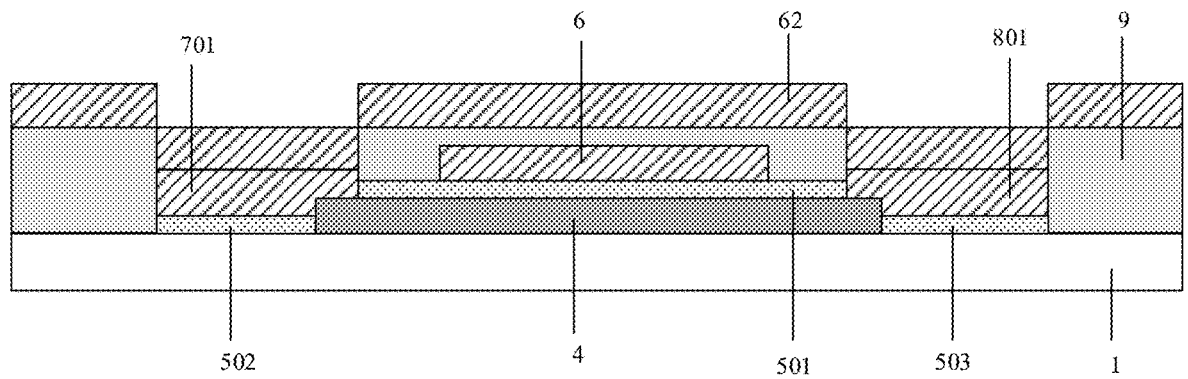

As illustrated in FIG. 2L, a second conductive material film 62 covering the first portion 701 of the first electrode, the first portion 801 of the second electrode and the first insulating layer 9 is formed. A material of the second conductive material film 62 and a specific method of forming the second conductive material film 62 can be referred to the above descriptions of the first conductive material film 61.

Figure 2M:
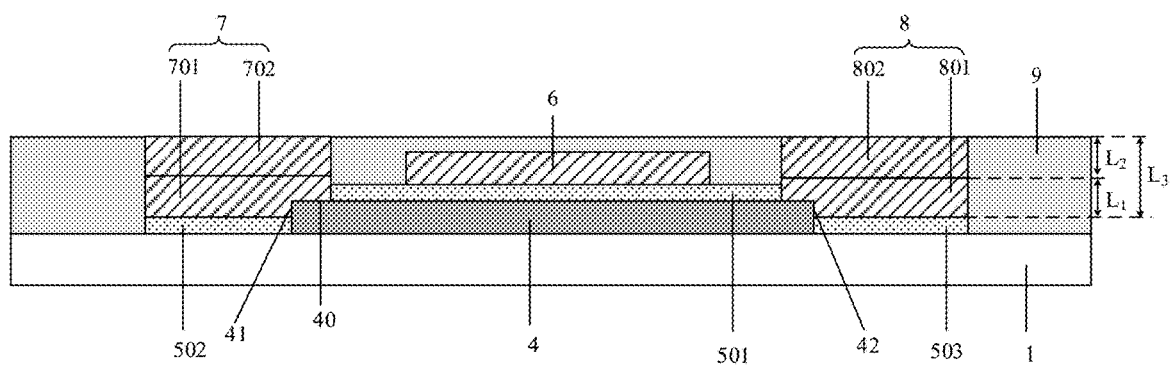

As illustrated in FIG. 2M, the second portion 702 of the first electrode and the second portion 802 of the second electrode are simultaneously formed by a second patterning process performed on the second conductive material film 62 using a same mask, so that the first electrode 7 and the second electrode 8 are formed. The first portion 701 of the first electrode and the second portion 702 of the first electrode are stacked in the direction perpendicular to the base substrate 1, and the first portion 801 of the second electrode and the second portion 802 of the second electrode are stacked in the direction perpendicular to the base substrate 1.

For example, the second portion 502 of the gate insulating layer is between the first electrode 7 and the base substrate 1, and the third portion 503 of the gate insulating layer is between the second electrode 8 and the base substrate 1, so as to reduce the height difference between the height of the first electrode 7 and the heights of the layers above the first electrode 7 and reduce the height difference between the height of the second electrode 8 and the heights of the layers above the second electrode 8, and reduce the risk of wire breakage generated in the process of depositing the subsequent film layer.

For example, the semiconductor layer 4 comprises an upper surface 40 that is away from the base substrate, a first side surface 41 and a second side surface 42 that intersect the upper surface 40. The first side surface 41 is opposite to the second side surface 42. The first electrode 7 is in direct contact with the upper surface 40 and the first side surface 41, and the second electrode 8 is in direct contact with the upper surface 40 and the second side surface 42, so that both the first electrode 7 and the second electrode 8 are in direct contact with the semiconductor layer 4, which reduces the contact resistance of the first electrode 7 and the semiconductor layer 4 and reduces the contact resistance of the second electrode 8 and the semiconductor layer 4, compared with the case that the first electrode and the second electrode 8 are electrically connected to the semiconductor layer 4 in an indirect manner such as through via holes and wires.

For example, the first patterning process and the second patterning process are performed using a same mask, that is, the N patterning processes are performed using a same mask. In this way, only one mask needs to be provided, which simplifies the process, improves a production efficiency, and saves costs.

In the manufacture method of a thin film transistor provided by an embodiment of the present disclosure, in a case where at least one of a group consisting of the gate electrode, the first electrode, and the second electrode has a large thickness, in the process where the film layer used for forming the gate electrode, the first electrode, and the second electrode is patterned only once by a photolithography process to form the gate electrode, the first electrode, or the second electrode, the etching accuracy is lowered, and the uniformity error of the etching is large, and thereby the dimensional error (for example, CD Bias described above) of the gate electrode, the first electrode, or the first electrode is large, and the error of the interval between the first electrode and the second electrode is large, which causes the problem of the short circuit between the first electrode and the second electrode. According to the embodiments of the present disclosure, at least one of a group consisting of the gate electrode, the first electrode, and the second electrode is divided into N portions that are stacked, and the N portions are respectively formed by N patterning processes, which reduces the thickness of the film layer (e.g., the film layer to be etched) to be patterned in each of the N patterning processes, and thereby reducing the above dimensional error, and avoiding the technical problems caused by the above dimensional error.

For example, a total thickness of the N portions in the direction perpendicular to the base substrate (a sum of thicknesses of the N portions in the direction perpendicular to the base substrate) is more than 5500 angstroms, and a thickness of each portion of the N portions in the direction perpendicular to the base substrate is not more than 5,500 angstroms. For example, in the embodiment illustrated in FIGS. 2A-2M, in the direction perpendicular to the base substrate 1, both a thickness $L_1$ of the first portion 701 of the first electrode 7 and a thickness $L_2$ of the second portion 702 of the first electrode are not more than 5500 angstroms, and a sum thickness $L_3$ of the thickness of the first portion 701 of the first electrode 7 and the thickness of the second portion 702 of the first electrode is more than 5500 angstroms, as illustrated in FIG. 2M. Both a thickness of the first portion 801 of the second electrode and a thickness of the second portion 802 of the second electrode are not more than 5500 angstroms, and a sum thickness of the thickness of the first portion 801 of the second electrode and the thickness of the second portion 802 of the second electrode is more than 5500 angstroms. Patterns of the gate electrode, the first electrode, and the second electrode of the thin film transistor are generally formed by patterning (for example, patterning by a photolithography process) a film layer for forming the above structures. In some cases, the gate electrode, the first electrode, and the second electrode of the thin film transistor are required to have large thicknesses in the direction perpendicular to the base substrate. For example, in a display substrate, in order to achieve a better display effect, a high resolution is required. In this case, the thicknesses of the above structures (the gate electrode, the first electrode, and the second electrode of the thin film transistor) are increased to reduce the resistances of the above structures, so as to increase the signal transmission speed, the response time of the thin film transistor, and so on. In addition, the arrangement density of the thin film transistor is large, if the dimensional error of the electrodes of the thin film transistor is large, the distance between the adjacent electrodes is too small, thereby causing the signal interference and the short circuit generated between the adjacent electrodes. In a case where the thickness of the film layer is large, the dimensional error (for example, CD Bias described above) caused by patterning the film layer is large. In a case where the thickness of the film layer is more than 5500 angstroms, the resulting dimensional error is too large, which tends to cause the distance between adjacent electrodes of the thin film transistor to be too small, and thereby causing the signal interference and the short circuit generated between the adjacent electrodes. This problem is particularly serious especially in the case where the arrangement density of the thin film transistor is large. In the manufacture method of a thin film transistor provided by the embodiments of the present disclosure, the N portions of the gate electrode, the N portions of the first electrode, and the N portions of the second electrode are respectively formed by N patterning processes, and the thickness of the film layer patterned in each of the N patterning processes is reduced, and thereby reducing the dimensional error of each patterning process, even in the case where the thickness of the patterned film layer is more than 5500 angstroms, the above-mentioned dimensional error of the electrodes of the thin film transistor can be reduced, and thereby alleviating or avoiding the above problems of the signal interference and the short circuit caused by dimensional errors in the patterning processes.

Figure 3A:
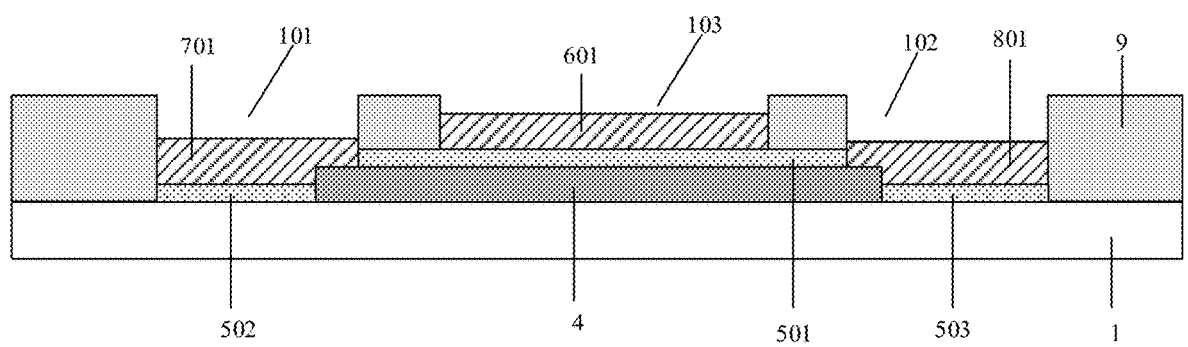
FIGS. 3A-3C are schematic diagrams of another manufacture method of a thin film transistor provided by an embodiment of the present disclosure.
Figure 3B:
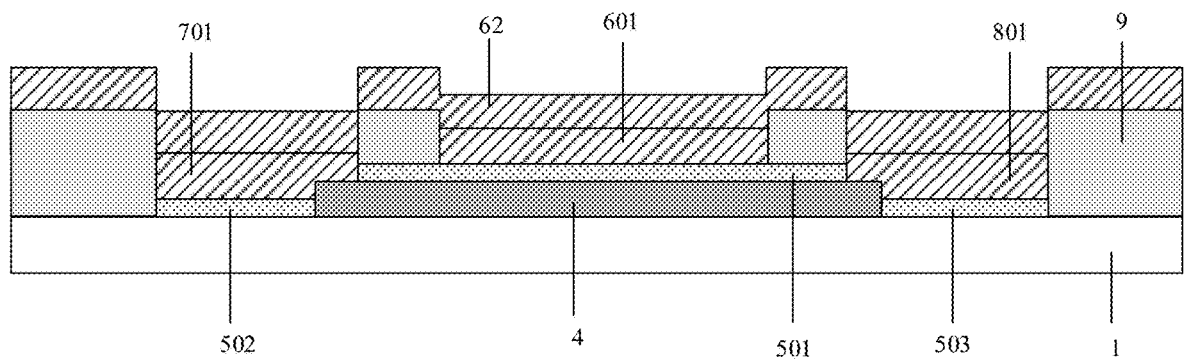
Figure 3C:
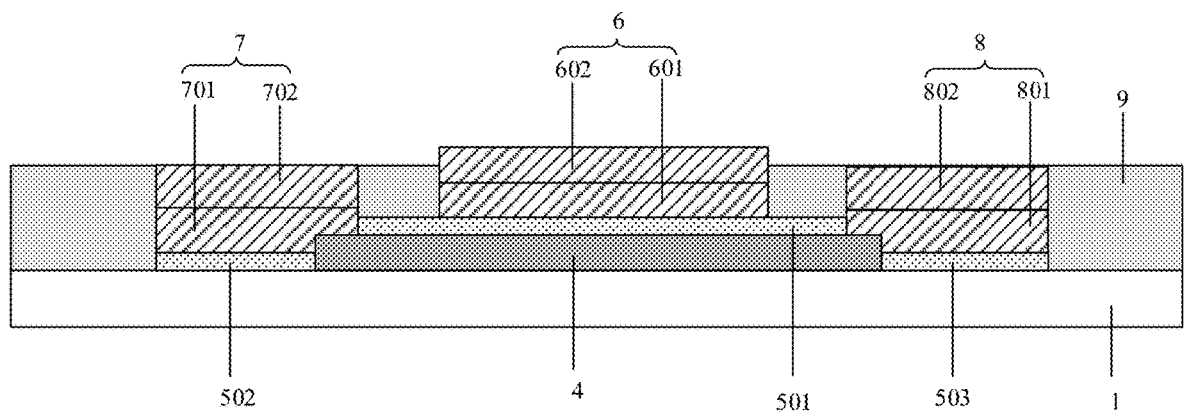

FIGS. 3A-3C are schematic diagrams of another manufacture method of a thin film transistor provided by an embodiment of the present disclosure. This embodiment differs from the embodiment illustrated in FIGS. 2A-2M in that, in this embodiment, the gate electrode comprises two portions that are stacked in the direction perpendicular to the base substrate, and this embodiment is illustrated by taking $N_1=N_2=N_3=2$, $M_1=M_2=M_3=1$, and $M_1=M_2=M_3=2$ as an example.

In the embodiment, the steps illustrated in FIGS. 3A-3C are performed after the steps illustrated in FIGS. 2A-2J are completed. When the steps illustrated in FIG. 2I is performed, a first patterning process is performed on the first conductive material film using a same mask to simultaneously form the first portion 601 of the gate electrode, the first portion 701 of the first electrode and the first portion 801 of the second electrode, so as to simplify the manufacture process. As illustrated in FIG. 3A, the first insulating material film 90 illustrated in FIG. 2J is patterned to form a first insulating layer 9, first insulating layer 9 comprises a first via hole 101 exposing the first portion 701 of the first electrode, a second via hole 102 exposing the first portion 801 of the second electrode, and the third via hole 103 exposing the first portion 601 of the gate electrode. For example, the first via hole 101 exposes the entire upper surface, which surface is away from the base substrate 1, of the first portion 701 of the first electrode, and the second via hole 102 exposes the entire upper surface, which surface is away from the base substrate 1, of the first portion 801 of the second electrode, and the third via hole 103 exposes the entire upper surface, which surface is away from the base substrate 1, of the first portion 601 of the gate electrode.

As illustrated in FIG. 3B, a second conductive material film 62 covering the first portion 601 of the gate electrode, the first portion 701 of the first electrode, the first portion 801 of the second electrode and the first insulating layer 9 is formed, and the material and the specific method of forming the second conductive material film 62 can be referred to the above descriptions of the first conductive material film 61.

As illustrated in FIG. 3C, a second patterning process is performed on the first conductive material film 61 using a same mask to simultaneously form the second portion 602 of the gate electrode, the second portion 702 of the first electrode and the second portion 802 of the second electrode, so that the gate electrode 6, the first electrode 7 and the second electrode 8 are formed. The first portion 601 of the gate electrode and the second portion 602 of the gate electrode are stacked in the direction perpendicular to the base substrate 1, the first portion 701 of the first electrode and the second portion 702 of the first electrode are stacked in the direction perpendicular to the base substrate 1, and the first portion 801 of the second electrode and the second portion 802 of the second electrode are stacked in the direction perpendicular to the base substrate 1. The surface, which faces the second portion 602 of the gate electrode, of first portion 601 of the gate electrode is in direct contact with the surface, which faces the first portion 601 of the gate electrode, of the second portion 602 of the gate electrode (adhered to each other), the surface, which faces the second portion 702 of the first electrode, of the first portion 701 of the first electrode is in direct contact with the surface, which faces the first electrode of 701 of the first electrode, of second portion 702 of the first electrode (adhered to each other), and the surface, which faces the second portion 802 of the second electrode, of the first portion 801 of the second electrode is in direct contact with the surface, which faces the first electrode 801 of the second electrode, of the second portion 802 of the second electrode (adhered to each other). Other features of the thin film transistor formed by the method provided by this embodiment are the same as those of the thin film transistor formed by the method illustrated in FIGS. 2A to 2M, and the features not mentioned in this embodiment can be referred to the above descriptions, and are not repeated here.

At least one embodiment of the present disclosure further provides a manufacture method of an array substrate, and the method comprises forming a thin film transistor by any one of the manufacture methods of a thin film transistor provided by the embodiments of the present disclosure.

For example, the manufacture method of an array substrate provided by at least one embodiment of the present disclosure further comprises: forming a signal line on the base substrate, in which the signal line comprises $N_4$ portions that are stacked in a direction perpendicular to the base substrate, adjacent two portions of the $N_4$ portions are in direct contact with each other, and $N_4$ a positive integer more than or equal to 2. Forming the signal line comprises: performing $N_4$ patterning processes to respectively form the $N_4$ portions. Forming the $N_4$ portions respectively by the $N_4$ patterning processes can reduce the thickness of the film layer (for example, the film layer to be etched) to be patterned in each patterning process, and thereby reducing the dimensional error (for example, the CD Bias mentioned above) of the signal line during the patterning processes, and improving the etching uniformity. Therefore, in a case where the signal line has a large thickness in the direction perpendicular to the base substrate (for example, in the display substrate, in order to achieve a better display effect, under a premise of ensuring high-density wire arrangement to achieve a high resolution, the thickness of the signal line is increased to reduce the resistance of the signal line, so as to increase the signal transmission speed), problems of the short circuit and the signal interference generated between the signal lines caused by the large dimensional error of forming thick signal lines are solved.

For example, the signal lines may comprise at least one of a group consisting of a gate line electrically connected to the gate electrode, a data line electrically connected to the first electrode, a common voltage line providing a common voltage and a ground line.

Illustratively, FIGS. 4A-4M are schematic diagrams of a manufacture method of an array substrate provided by an embodiment of the present disclosure. This embodiment is illustrated by taking $N_1=N_2=N_3=N_4=2$, and the signal line comprising the gate line, the data line, and the ground line (and/or the common voltage line) as an example.

Figure 4A:
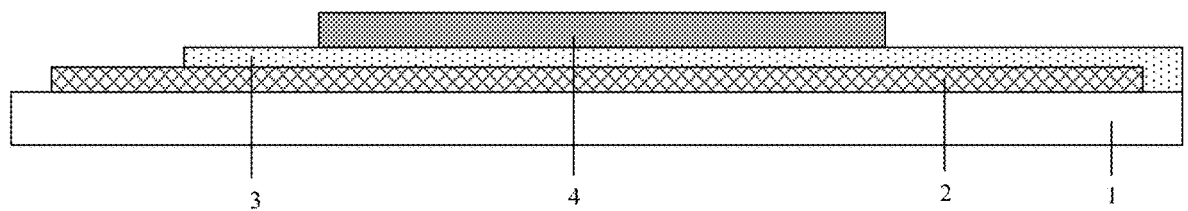
FIGS. 4A-4S are schematic diagrams of a manufacture method of an array substrate provided by an embodiment of the present disclosure.

As illustrated in FIG. 4A, the manufacture method of an array substrate further comprises forming a light shielding layer 2 on the base substrate 1, the light shielding layer 2 is located on a side, which side is away from the gate electrode, of the semiconductor layer 4 to be formed later, and an orthographic projection of the light shielding layer 2 on the base substrate 1 at least partially overlaps an orthographic projection of a channel region of the semiconductor layer of the thin film transistor on the base substrate 1, that is, the light shielding layer 2 and the channel region of the thin film transistor are at least partially overlapped in the direction perpendicular to the base substrate 1, thereby preventing light from being irradiated to the channel region to affect the performance of the thin film transistor. For example, a material of the light shielding layer 2 may be a metal material or an organic material that is opaque. The manufacture method of the array substrate further comprises forming a second insulating layer 3 and a semiconductor layer 4, and the second insulating layer 3 is between the light shielding layer 2 and the semiconductor layer 4 to insulate the light shielding layer 2 and the semiconductor layer 4. For example, the second insulating layer 3 exposes a portion of the light shielding layer 2 by a patterning process performed on the second insulating layer 3.

For example, the manufacture method of the array substrate further comprises: forming a gate insulating layer, in which the gate insulating layer comprises: a first portion, a second portion, a third portion and a fourth portion. The first portion is between the gate electrode and the semiconductor layer, so as to insulate the gate electrode and the semiconductor layer, the first portion exposes the upper surface, which surface is used for contact with the first electrode and the second electrode, of the semiconductor layer, exposes the first side surface, which surface is used for contact with the first electrode, of the semiconductor layer, and exposes the second side surface, which surface is used for contact with the second electrode, of the semiconductor layer. The second portion is between the first electrode and the base substrate, the third portion is between the second electrode and the base substrate, and the fourth portion is between the ground line (or common voltage) to be formed later and the first electrode of the thin film transistor, so as to insulate the ground line (or common voltage) to be formed later and the first electrode of the thin film transistor.

Figure 4B:
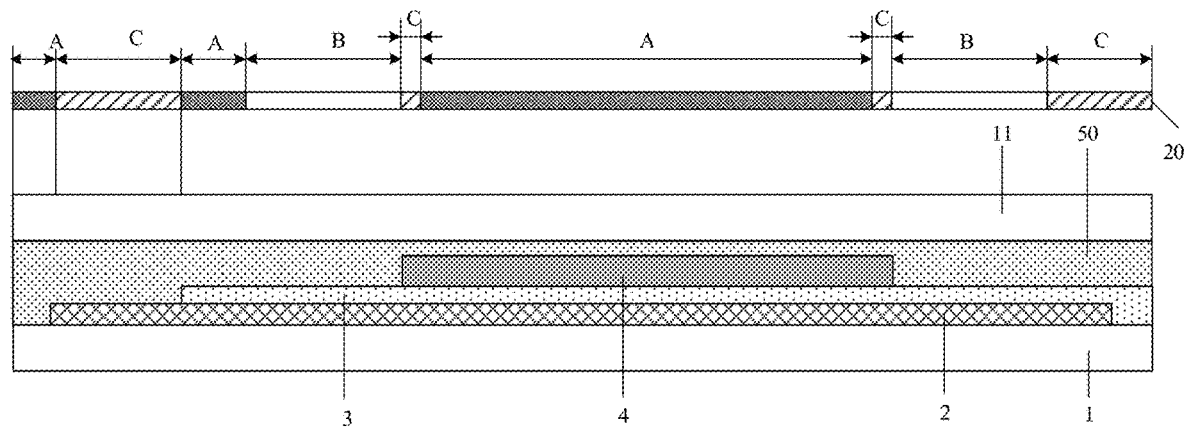

Illustratively, as illustrated in FIG. 4B, forming the gate insulating layer comprises: forming a gate insulating material film 50 covering the gate electrode 4 on the base substrate 1. The material and the method of forming the gate insulating layer material film 50 are referred to the descriptions of the manufacture method of the thin film transistor in the above embodiment. For example, forming the gate insulating layer further comprises: forming a photoresist layer 11 covering the gate insulating material film 50, and exposing and developing the photoresist layer 11 using a two-tone mask 20. A portion of the photoresist layer 11 in a photoresist removing region C is removed and a portion of the photoresist layer 11 in a photoresist partially remaining region B is thinned by development, so as to obtain a photoresist remaining region A, a photoresist partially remaining region B, and a photoresist removing region C. The photoresist remaining region A comprises a region where the first portion of the gate insulating layer is to be formed and a region where the fourth portion of the gate insulating layer is to be formed, the photoresist partially remaining region B is a region where the second portion and the third portion of the gate insulating layer are to be formed, and the photoresist removing region C is a region except the photoresist remaining region and the photoresist partially remaining region.

Figure 4C:
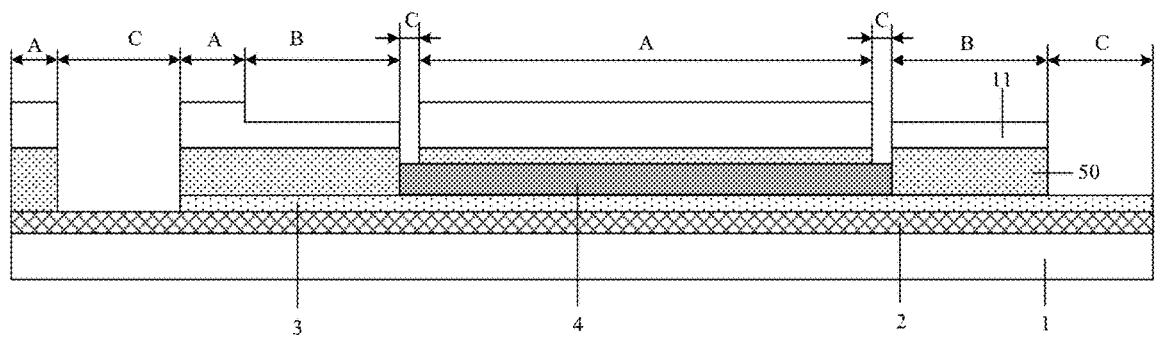

As illustrated in FIG. 4C, a first etching process is performed to remove a portion of the gate insulating material film 50 in the photoresist removing region C.

Figure 4D:
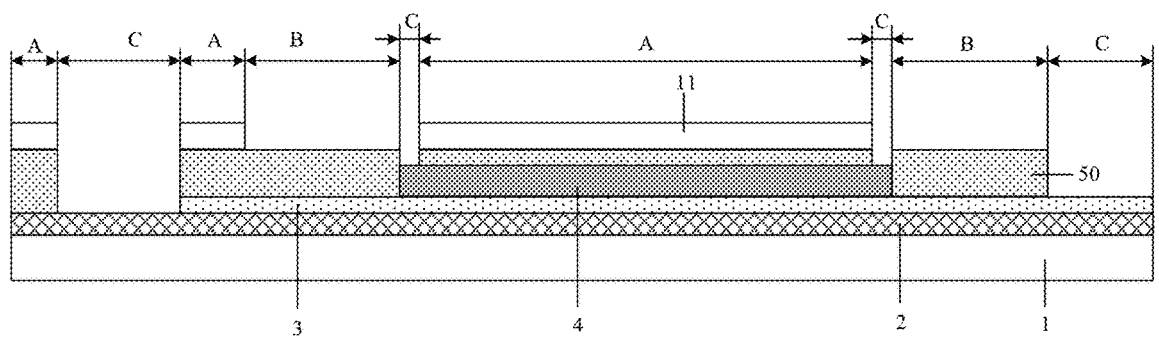

As illustrated in FIG. 4D, performing an ashing process, so as to remove a portion of the photoresist layer 11 in the photoresist partially remaining region B and thin a portion of the photoresist layer 11 in the photoresist remaining region A.

Figure 4E:
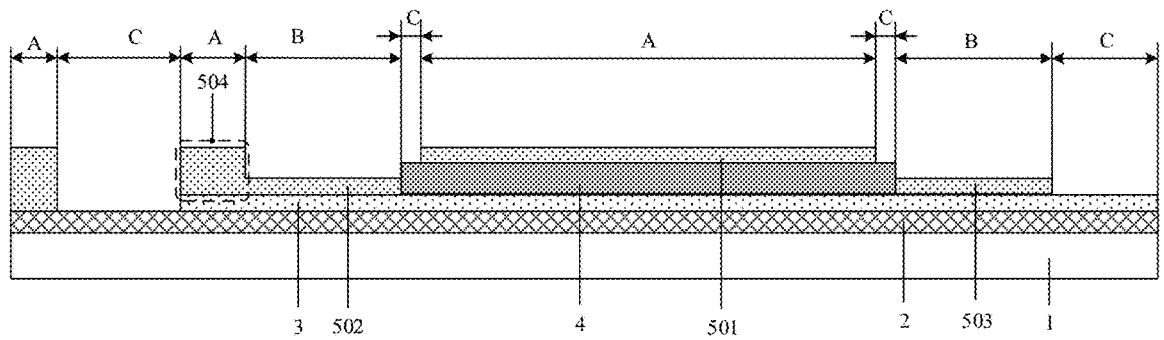

As illustrated in FIG. 4E, a second etching process is performed to thin a portion of the gate insulating material film in the photoresist partially remaining region B to form the first portion 501 of the gate insulating layer, the second portion 502 of the gate insulating layer, the third portion 503 of the gate insulating layer and the fourth portion 504 of the gate insulating layer, and removing a portion of the photoresist layer 11 in the photoresist remaining region A. The first portion 501 exposes the upper surface 40 of the semiconductor layer 4, in which the upper surface 40 is used for contact with the first electrode and the second electrode, exposes the first side surface 41 of the semiconductor layer 4, in which the semiconductor layer 4 is used for contact with the first electrode, and exposes the second side surface 42 of the semiconductor layer 4, in which the second side surface 42 is used for contact with the second electrode. The fourth portion 504 is on a side, which side is away from the semiconductor layer 4, of the second portion 502, and a thickness of the fourth portion 504 in the direction perpendicular to the base substrate 1 is more than a thickness of the second portion 502 in the direction perpendicular to the base substrate 1, so that the fourth portion 504 insulates the ground line (and/or the common voltage line) to be formed later from the first electrode of the thin film transistor.

For example, in a direction from a position close to the base substrate to a position away from the base substrate, the $N_4$ portions of the signal line are sequentially a first portion, a second portion . . . , and a $N_4$-th portion, the $N_1$ portions of the gate electrode are sequentially a first portion, a second portion . . . , and a $N_1$-th portion, the $N_2$ portions of the first electrode are sequentially a first portion, a second portion . . . , and a $N_2$-th portion, and the $N_3$ portions of the second electrode are sequentially a first portion, a second portion . . . , and a $N_3$-th portion. Simultaneously forming a $M_4$-th portion of the signal line, a $M_1$-th portion of the gate electrode, a $M_2$-th portion of the first electrode, and a $M_3$-th portion of the second electrode by one patterning process using a same mask; $M_1$ is a positive integer less than or equal to $N_1$, $M_2$ is a positive integer less than or equal to $N_2$, $M_3$ is a positive integer less than or equal to $N_3$, and $M_4$ is a positive integer less than or equal to $N_4$.

In the following, the case $M_1=M_2=M_3=M_4$ is taken as an example to illustrate.

Figure 4F:
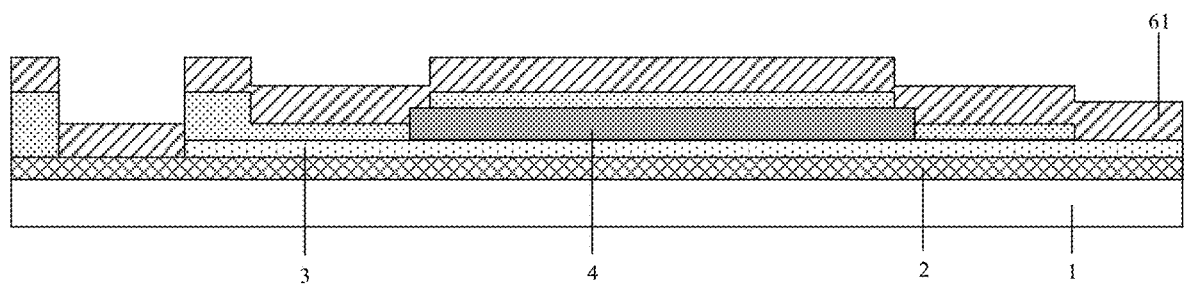

As illustrated in FIG. 4F, a first conductive material film 61 covering the semiconductor layer 4, the gate insulating layer and the light shielding layer 2 is formed, and the first conductive material film 61 is in direct contact with the light shielding layer 2. The first conductive material film 61 is used for forming a first portion of the gate electrode, a first portion of the gate line, a first portion of the first electrode, a first portion of the second electrode and a first portion of the ground line (and/or the common voltage line). For example, a material of the first conductive material 61 is a metal material, for example, the metal material comprises at least one of a group consisting of copper, molybdenum, a copper alloy, a molybdenum alloy, or the like. For example, the first conductive material film 61 is formed by a chemical vapor deposition (CVD) method or a magnetron sputtering method.

Figure 4G:
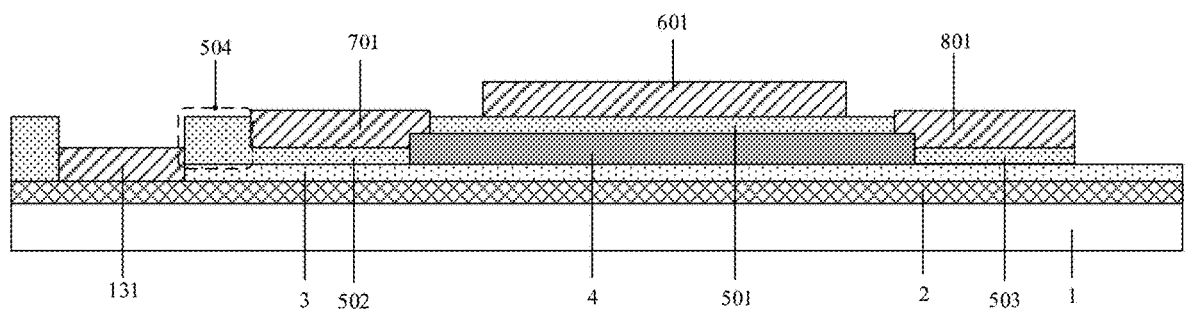

As illustrated in FIG. 4G, a first patterning process is performed on the first conductive material film 61 using a same mask to simultaneously form the first portion 601 of the gate electrode, the first portion 141 of the gate line (refer to FIG. 4H), the first portion 701 of the first electrode, the first portion 801 of the second electrode and the first portion 131 of the ground line (and/or the common voltage line). For example, the first portion of the gate line and the first portion 601 of the gate electrode are integrally formed. In this way, the method illustrated in FIG. 4G simplifies the manufacture process compared with a case where the gate electrode 6, the first portion 701 of the first electrode, and the first portion 801 of the second electrode are formed by a plurality of patterning processes, respectively.

Figure 4H:
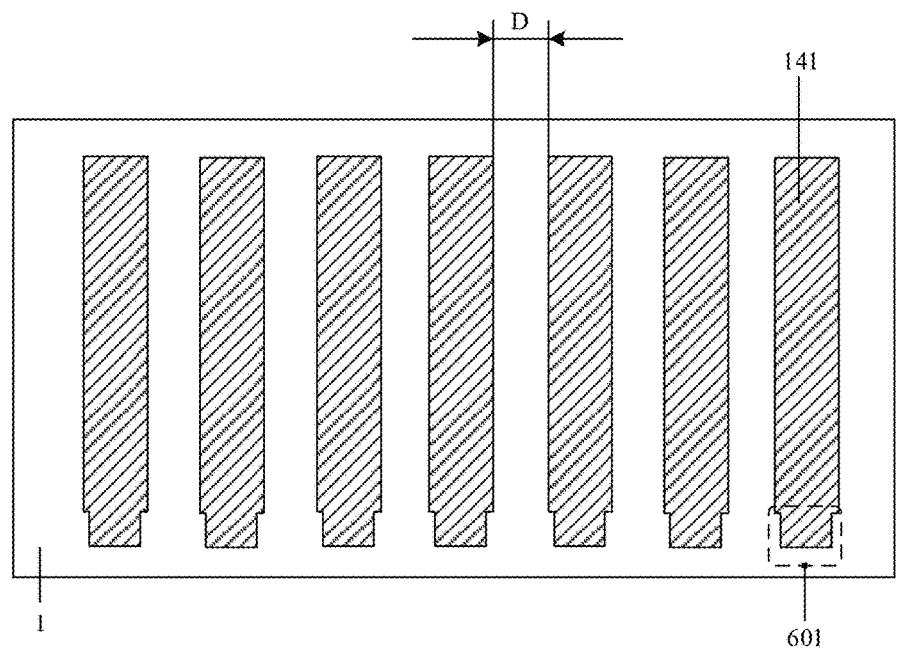
Figure 4I:
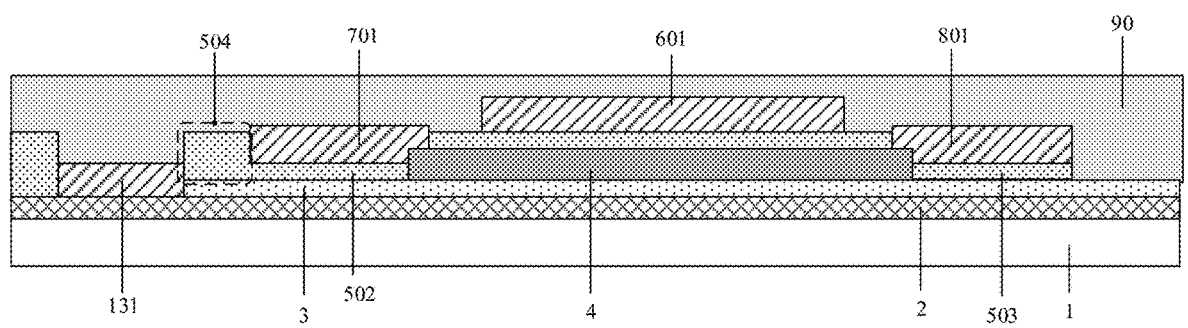

As illustrated in FIG. 4I, a first insulating material film 90 covering the first portion 601 of the gate electrode, the first portion 141 of the gate line, the first portion 701 of the first electrode, the first portion 801 of the second electrode, and the first portion 131 of the ground line (and/or the common voltage line) are formed. The material and the method of forming the first insulating material film 90 can be referred to the above descriptions of the gate insulating material film.

Figure 4J:
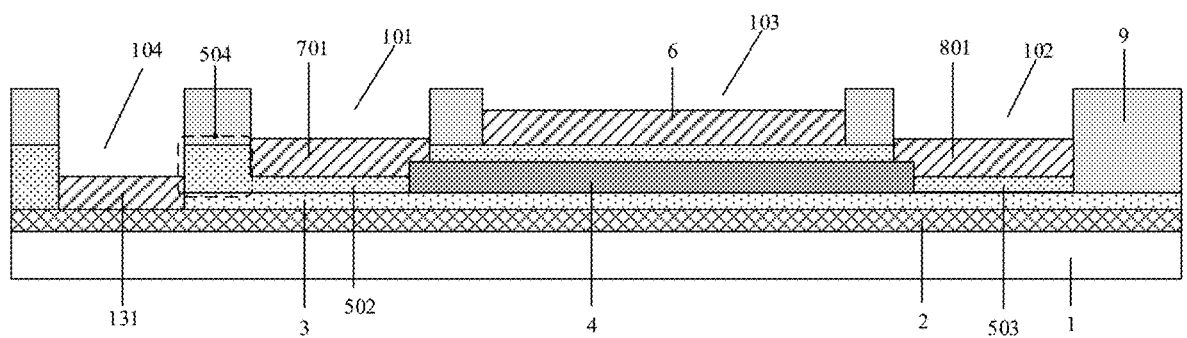

As illustrated in FIG. 4J, the first insulating material film 90 is patterned to form a first insulating layer 9, the first insulating layer 9 comprises a first via hole 101 exposing the first portion 701 of the first electrode, a second via hole 102 exposing the first portion 801 of the second electrode, a third via hole 103 exposing the first portion 601 of the gate electrode and the first portion 141 of the gate line, and a fourth via hole 104 exposing the first portion 131 of the ground line (and/or the common voltage line). For example, the first via hole 101 exposes the entire upper surface, which surface is away from the base substrate 1, of the first portion of the first electrode 701, the second via hole 102 exposes the entire upper surface, which surface is away from the base substrate 1, of the first portion 801 of the second electrode, the third via hole 103 exposes the entire upper surfaces, which surface is away from the base substrate 1, of the first portion 601 of the gate electrode and the first portion 131 of the gate line, and the fourth via hole 104 exposes the entire upper surface, which surface is away from the base substrate 1, of the first portion 131 of the ground line (and/or the common voltage line). For example, a planar pattern of the third via hole 103 is same as an entire planar pattern of the gate electrode and the gate line, and a planar pattern of the fourth via hole 104 is the same as a planar pattern of the ground line.

Figure 4K:
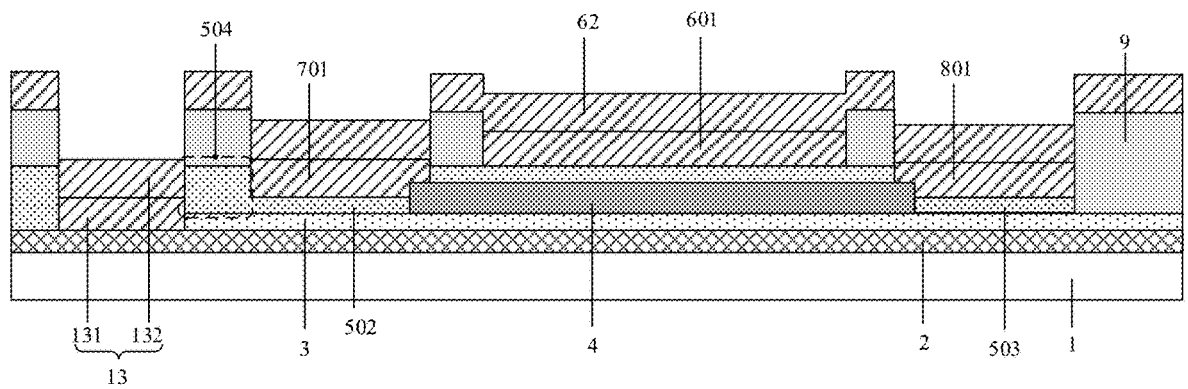

As illustrated in FIG. 4K, a second conductive material film 62 covering the first portion 601 of the gate electrode, the first portion 141 of the gate line, the first portion 701 of the first electrode, the first portion 801 of the second electrode, the first portion 131 of the ground line (and/or the common voltage line), and the first insulating layer 9 is formed. A material and specific method of forming the second conductive material film 62 can be referred to the above descriptions of the first conductive material 61.

Figure 4L:
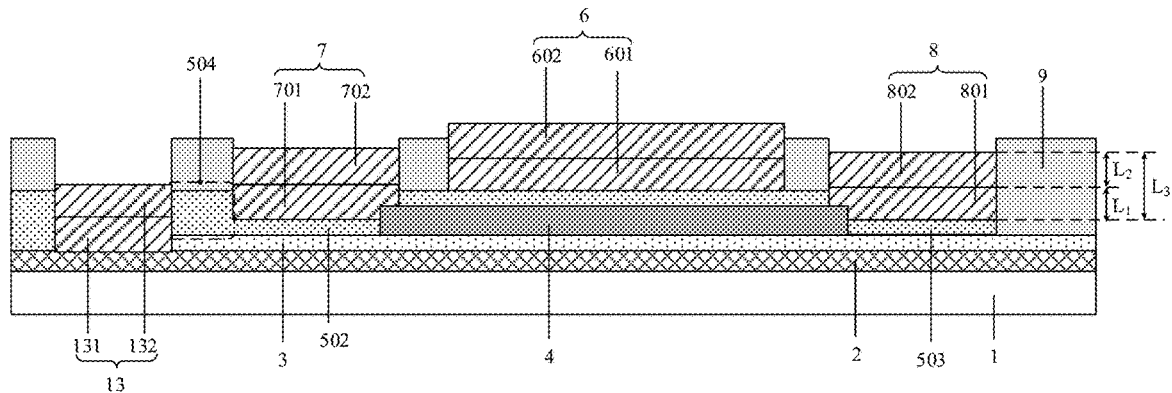
Figure 4M:
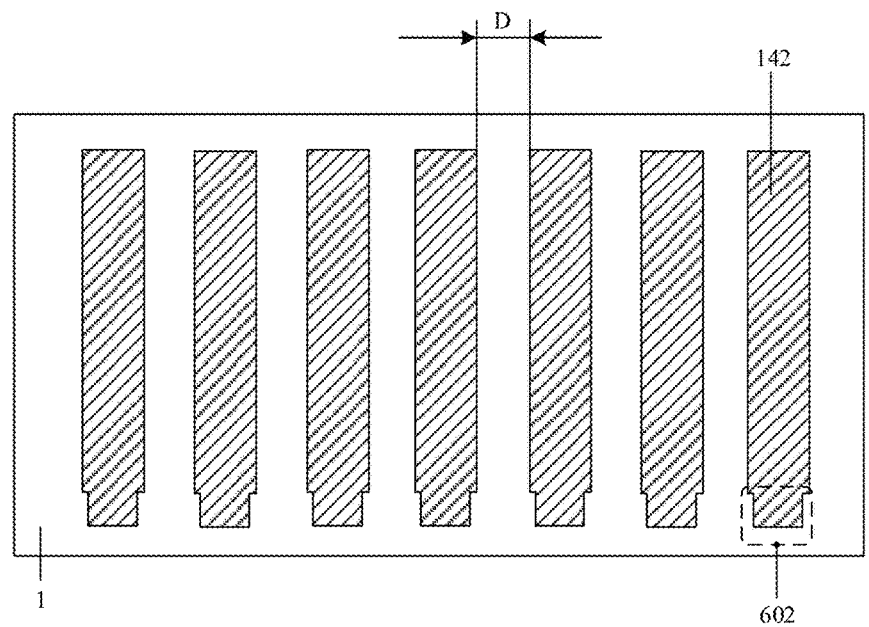

As illustrated in FIG. 4L, a second patterning process is performed on the second conductive material film 62 using a same mask to simultaneously form the second portion 602 of the gate electrode, the second portion 143 of the gate line (refer to FIG. 4M), the second portion 702 of the first electrode, the second portion 802 of the second electrode, and the second portion 132 of the ground line, so as to form the gate electrode 6, the gate line, the first electrode 7, the second electrode 8, and the ground line 13. The first portion 601 of the gate electrode and the second portion 602 of the gate electrode are stacked in the direction perpendicular to the base substrate 1, the first portion 141 of the gate line and the second portion 142 of the gate line are stacked in the direction perpendicular to the base substrate 1, the first portion 701 of the first electrode and the second portion 702 of the first electrode are stacked in the direction perpendicular to the base substrate 1, the first portion 801 of the second electrode and the second portion 802 of the second electrode are stacked in the direction perpendicular to the base substrate 1, and the first portion 131 of the ground line (and/or the common voltage line) and the second portion 132 of the ground line (and/or the common voltage line) are stacked in the direction perpendicular to the base substrate 1. Moreover, in a case where the material of the light shielding layer 2 is a conductive material (for example, a metal material), the ground line 13 is in direct contact with the light shielding layer 2 to electrically connect the ground line 13 and the light shielding layer 2, so that a floating voltage generated by the light shielding layer 2 is eliminated. The floating voltage can affect the threshold voltage of the thin film transistor, thereby affecting the control function of the thin film transistor. For example, in other embodiments, the ground line 13 can also be replaced with a common voltage line for providing a common voltage.

For example, the first patterning process and the second patterning process are performed using a same mask, that is, the N patterning processes are performed using a same mask. In this way, only one mask needs to be provided, which simplifies the process, improves production efficiency, and saves costs.

Figure 4N:
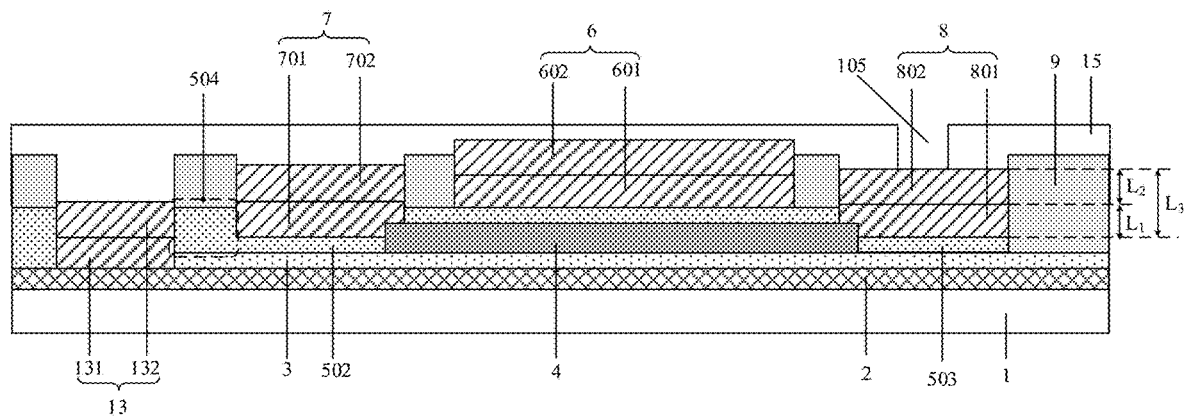

As illustrated in FIG. 4N, the manufacture method of an array substrate further comprises: forming an interlayer insulating layer 15 covering the gate line, the gate electrode 6, the first electrode 7, and the second electrode 8, and the interlayer insulating layer 15 comprises a fifth via hole 105 exposing the second electrode.

For example, the manufacture method of an array substrate further comprises forming a data line on the interlayer insulating layer 15, and the data line is electrically connected to the second electrode 8 through the fifth via 105. For example, the data line comprises two portions that are stacked in the direction perpendicular to the base substrate 1, and two portions of the data line are respectively formed by the two patterning processes.

Figure 4O:
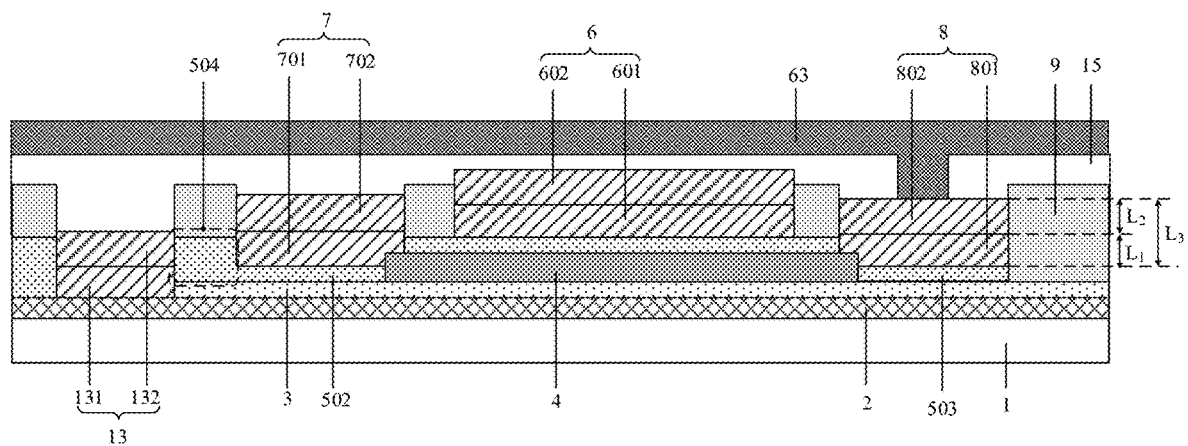

As illustrated in FIG. 4O, a third conductive material film 63 covering the semiconductor layer 4 and the gate insulating layer is formed. A material and a specific method of forming the third conductive material film 63 can be referred to the previous descriptions of the first conductive material 61.

Figure 4P:
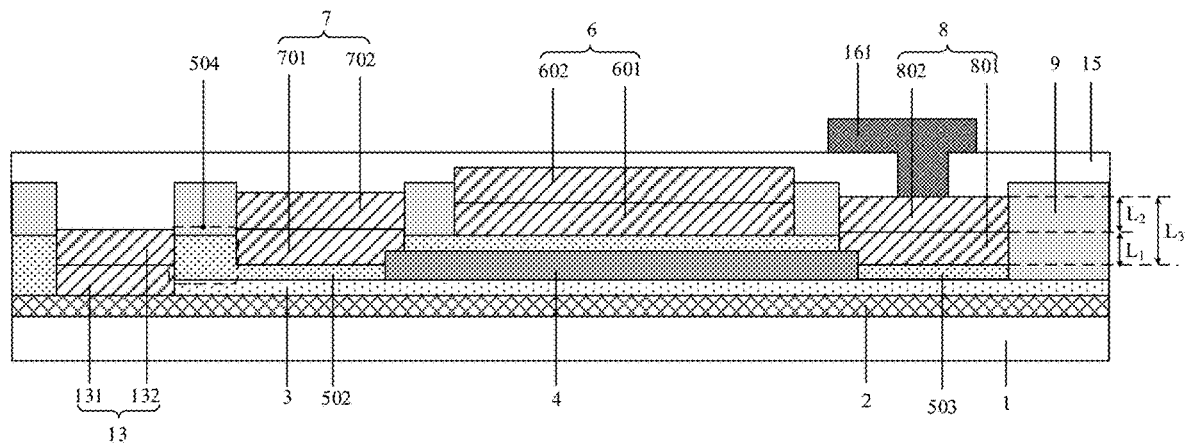

As illustrated in FIG. 4P, a first patterning process is performed on the third conductive material film 63 using a same mask to form a first portion 161 of the data line. The first portion 161 of the data line is in direct contact with the second electrode 8 through the fifth via hole 105 to achieve electrical connection.

Figure 4Q:
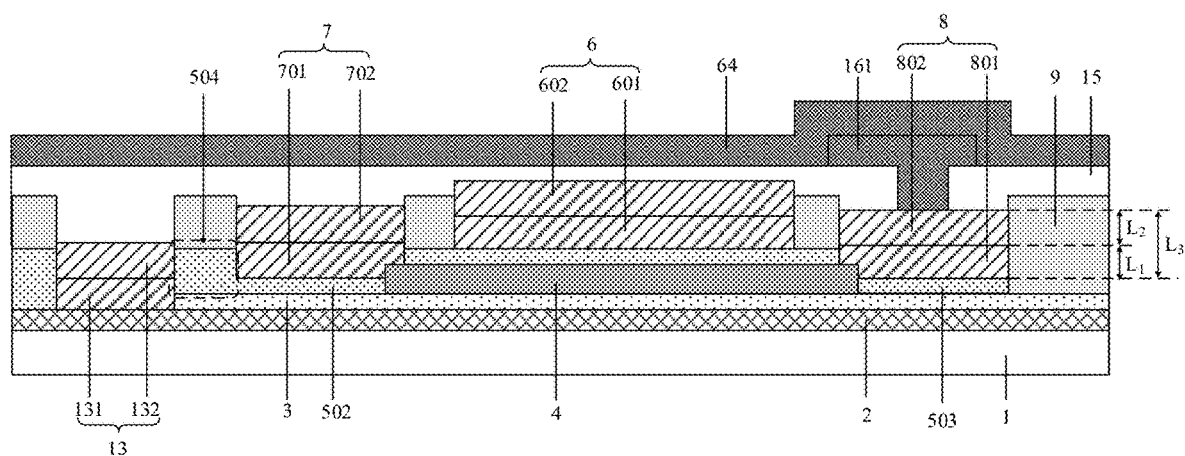

As illustrated in FIG. 4Q, a fourth conductive material film 64 covering the first portion 161 of the data line is formed. A material and a specific forming method of the fourth conductive material film 64 can be referred to the previous descriptions of the first conductive material 61.

Figure 4R:
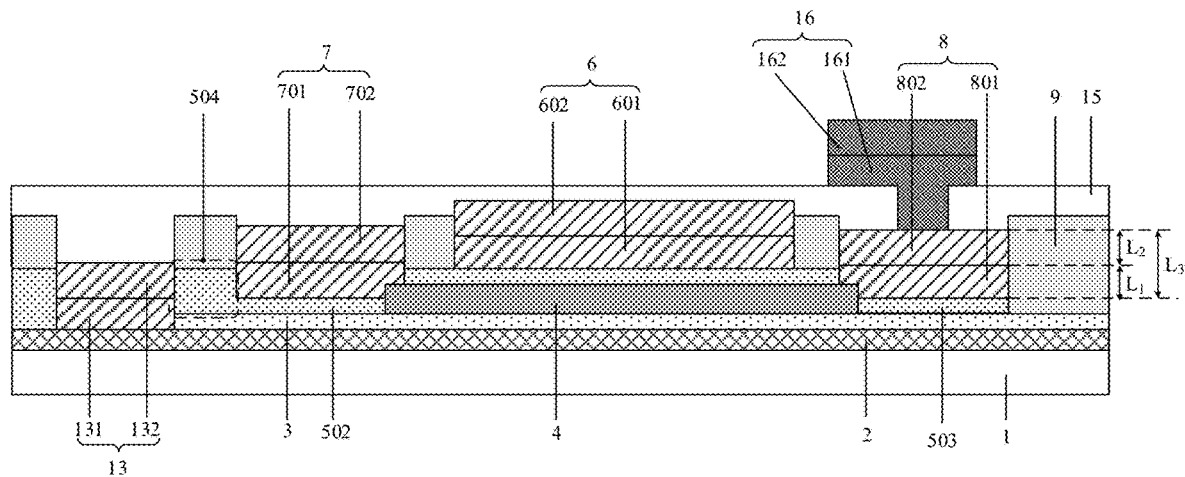

As illustrated in FIG. 4R, a second patterning process is performed on the fourth conductive material film 64 using the single mask to form a second portion 162 of the data lines, thereby forming the data line 16. The data line 16 intersects and is insulated from the gate line 6. The first portion 161 of the data line and the second portion 162 of the data line are stacked in the direction perpendicular to the base substrate 1.

For example, the first patterning process and the second patterning process for forming the data line 16 are performed using the same mask. In this way, only one mask needs to be provided, which simplifies the process, improves production efficiency, and saves costs.

For example, a total thickness of the N portions in the direction perpendicular to the base substrate is more than 5500 angstroms, and a thickness of each portion of the N portions in the direction perpendicular to the base substrate is not more than 5500 angstroms. For example, in the embodiment illustrated in FIGS. 4A-4R, in the direction perpendicular to the base substrate 1, both a thickness of the first portion 601 of the gate electrode and a thickness of the second portion 602 of the gate electrode are not more than 5500 angstroms, and a sum thickness of the thickness of the first portion 601 of the gate electrode and the thickness of the second portion 602 of the gate electrode is more than 5500 angstroms. Both a thickness of the first portion 141 of the gate line and a thickness of the second portion 142 of the gate line are not more than 5500 angstroms, and a sum thickness of the thickness of the first portion 141 of the gate line and the thickness of the second portion 142 of the gate line is more than 5500 angstroms. Both a thickness $L_1$ of the first portion 701 of the first electrode 7 and a thickness $L_2$ of the second portion 702 of the first electrode 7 are not more than 5500 angstroms, and a sum thickness $L_3$ of the thickness of the first portion 701 of the first electrode 7 and the thickness of the second portion 702 of the first electrode 7 is more than 5500 angstroms. Both a thickness of the first portion 801 of the second electrode and a thickness of the second portion 802 of the second electrode are not more than 5500 angstroms, and a sum thickness of the thickness of the first portion 801 of the second electrode and the thickness of the second portion 802 of the second electrode is more than 5500 angstroms. Both a thickness of the first portion 161 of the data line and a thickness of the second portion 162 of the data line are not more than 5500 angstroms, and a sum thickness of the thickness of the first portion 161 of the data line and the thickness of the second portion 162 of the data line is more than 5500 angstroms. Both a thickness of the first portion 131 of the ground line (and/or the common voltage line) and a thickness of the second portion 132 of the ground line are not more than 5500 angstroms, and a sum thickness of the thickness of the first portion 131 of the ground line (and/or the common voltage line) and the thickness of the second portion 132 of the ground line is more than 5500 angstroms. Further, in the case where the arrangement density of the thin film transistor and the signal lines are required to be large, for example, the array substrate is a display substrate, in the display substrate of a high resolution, the distance between adjacent signal lines is small. For example, as illustrated in FIG. 4H, the array substrate comprises a plurality of signal lines (taking data lines as an example) extending in a same direction, and an interval D between adjacent data lines of the plurality of data lines is less than or equal to 6 μm. This interval D is small. Patterns of the gate electrode, the first electrode, the second electrode and the signal line of the thin film transistor are generally formed by patterning (for example, patterning by a photolithography process) a film layer for forming the above structures. In a case where the thicknesses, in the direction perpendicular to the base substrate, respectively of the gate electrode, the first electrode, the second electrode, and the signal line of the thin film transistor are required to be large (for example, in the display substrate, in order to achieve a better display effect, under the premise of ensuring high-density wire arrangement to achieve high resolution, the thicknesses of the above structures are increased to reduce the resistance of the above structures, so as to increase the signal transmission speed and the response time of the thin film transistor), and the thickness of the film layer is large, the dimensional error (such as the CD Bias described above) generated by the patterning is large. In a case where the thickness of the film layer is more than 5500 angstroms, the generated dimensional error tends to cause the distance between adjacent data lines to be too small, resulting in the signal interference and the short circuit generated between adjacent electrodes. Especially in the case where the distance between adjacent data lines is less than or equal to 6 μm (for example, in order to achieve high resolution in a display substrate, the wire density is high), the large dimensional error causes the distance between adjacent data lines to be too small, thereby causing signal interference and short circuit generated between adjacent electrodes. In the manufacture method of an array substrate provided by the embodiment, $N_4$ portions of the data line are respectively formed by $N_4$ patterning processes, thereby reducing the thickness of each film layer patterned in each pattering process, and reducing the dimensional error of each patterning process. Even in the case where the thickness of the patterned film layer is more than 5500 angstroms, dimensional errors of adjacent electrodes and data lines of the thin film transistor are small, thereby alleviating or avoiding the problems of the above-mentioned signal interference and short circuit caused by the dimensional error in the patterning process.

Of course, in other embodiments of the present disclosure, the order of forming the gate line and the data line is not limited. For example, as long as the $N_4$ portions of the gate line and $N_4$ portions of the data line are respectively formed by $N_4$ patterning processes. For example, the gate electrode, the data line, the ground line, the first electrode, and the second electrode are simultaneously formed, and then the interlayer insulating layer covering the gate electrode, the data line, the ground line, the first electrode, and the second electrode is formed. The interlayer insulating layer comprises a via hole exposing the gate electrode, and then a gate line is formed, and the gate line is electrically connected to the gate electrode through the via hole.

Figure 4S:
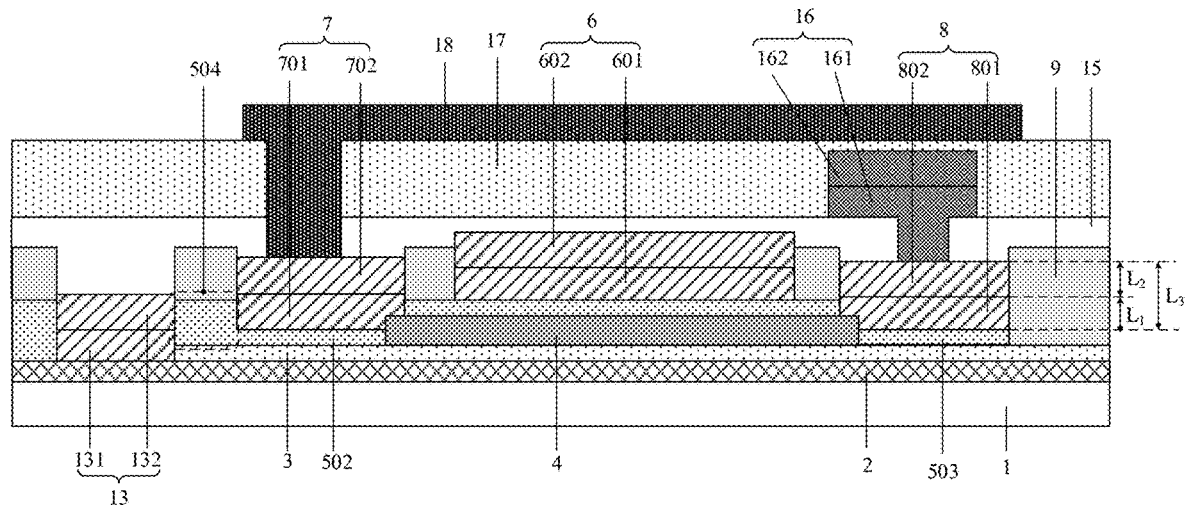

As illustrated in FIG. 4S, for example, the array substrate is a display substrate, and the manufacture method of the array substrate further comprises: forming a third insulating layer 17 covering the data line 16 and the interlayer insulating layer 15, and forming a pixel electrode 18. The third insulating layer 17 comprises a via hole exposing the first electrode 7, and the pixel electrode 18 is electrically connected to the first electrode 7 through the via hole.

At least one embodiment of the present disclosure further provides an array substrate, the array substrate is formed by any one of the manufacture methods of the array substrate provided by the embodiments of the present disclosure.

Figure 5:
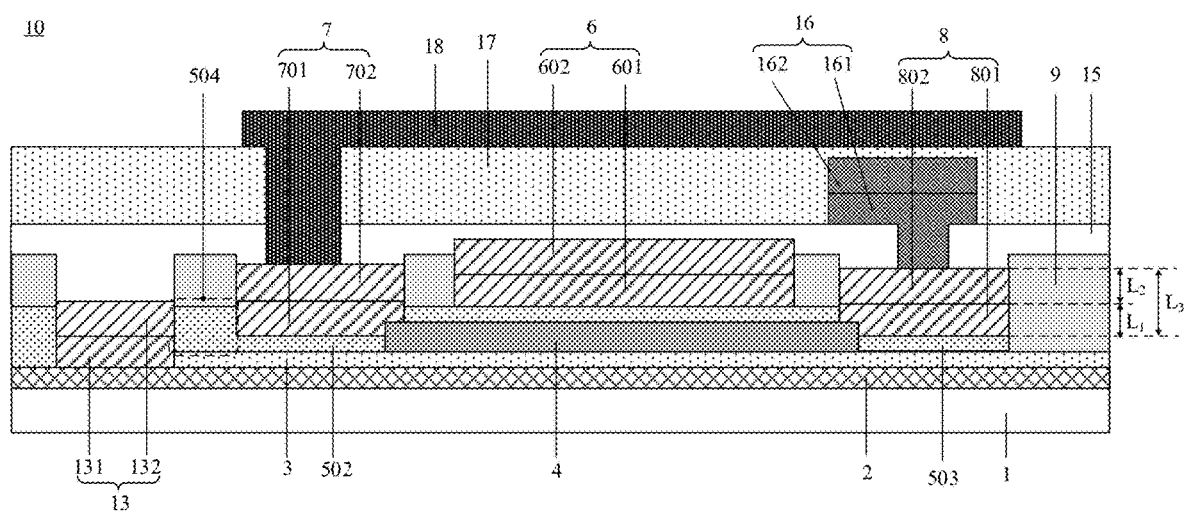
FIG. 5 is a structural schematic diagram of an array substrate provided by an embodiment of the present disclosure.

FIG. 5 is a structural schematic diagram of an array substrate provided by an embodiment of the present disclosure. For structural features of the array substrate, please refer to the descriptions in the previous embodiments. In the array substrate provided by the embodiment of the present disclosure, the dimension accuracy of the gate electrode, the first electrode, the second electrode, and the signal line of the thin film transistor is high. In the case where the thicknesses, in the direction perpendicular to the base substrate, respectively of the gate electrode, the first electrode, the second electrode and the signal line of the thin film transistor are large (for example, in the display substrate, in order to achieve a better display effect, under the premise of ensuring high-density wire arrangement to achieve high resolution, the thicknesses of the above structures are increased to reduce the resistance of the above structures, so as to increase the signal transmission speed and response time of the thin film transistor), patterns of the above structures are generally formed by patterning (for example, patterning by a photolithography process) the film layer for forming the above structures. In the case where the thickness of the film layer is large, the dimensional error generated by the patterning is large. However, in the manufacture method of the array substrate provided by the embodiments of the present disclosure, the gate electrode, the first electrode, the second electrode, and the signal line are formed by N patterning processes, the thickness of each film layer patterned in each patterning process is small, so that the dimensional accuracy of the finally obtained gate electrode, first electrode, second electrode, and signal line of the thin film transistor is high, thereby avoiding the problems of short circuit and signal interference generated between the electrodes of the thin film transistor and the signal lines caused by the dimensional error of the manufacture process.

For example, the array substrate is any substrate that needs to be controlled by thin film transistors and signal lines, such as a display substrate, an illumination substrate, and so on. The display substrate is, for example, an electroluminescence display substrate such as an organic light emitting diode (OLED) display substrate or an inorganic light emitting diode display substrate. Of course, the type of the array substrate is not limited to the types listed above.

The above is only an exemplary embodiment of the present invention, and is not intended to limit the scope of the present invention. The scope of the present invention is defined by the appended claims.

What is claimed is:

1. A manufacture method of a thin film transistor, comprising:
    providing a base substrate; and
    forming a gate electrode, a first electrode, a second electrode, and a semiconductor layer of the thin film transistor on the base substrate, wherein at least one of a group consisting of the gate electrode, the first electrode, and the second electrode comprises N portions that are stacked in a direction perpendicular to the base substrate, adjacent two portions of the N portions are in direct contact with each other, and N is a positive integer more than or equal to 2,
    wherein the method comprises: performing N patterning processes to respectively form the N portions;
    wherein the gate electrode comprises $N_1$ portions that are stacked in the direction perpendicular to the base substrate, the first electrode comprises $N_2$ portions that are stacked in the direction perpendicular to the base substrate, and the second electrode comprises $N_3$ portions that are stacked in the direction perpendicular to the base substrate; $N_1$, $N_2$, and $N_3$ are all positive integers more than or equal to 2;
    in a direction from a position close to the base substrate to a position away from the base substrate, the $N_1$ portions are sequentially a first portion, a second portion . . . , and a $N_1$-th portion, the $N_2$ portions are sequentially a first portion, a second portion . . . , and a $N_2$-th portion, and the $N_3$ portions are sequentially a first portion, a second portion . . . , and a $N_3$-th portion; and
    a $M_1$-th portion of the gate electrode, a $M_2$-th portion of the first electrode, and a $M_3$-th portion of the second electrode are simultaneously formed by one patterning process using a same mask, wherein $M_1$ is a positive integer less than or equal to $N_1$, $M_2$ is a positive integer less than or equal to $N_2$, and $M_3$ is a positive integer less than or equal to $N_3$.

2. The manufacture method of the thin film transistor according to claim 1, wherein $N_1=N_2=N_3$ and $M_1=M_2=M_3$.

3. A manufacture method of an array substrate, comprising: forming the thin film transistor by the manufacture method of the thin film transistor according to claim 1.

4. The manufacture method of the array substrate according to claim 3, further comprising:
    forming a signal line on the base substrate, wherein the signal line comprises $N_4$ portions that are stacked in the direction perpendicular to the base substrate, adjacent two portions of the $N_4$ portions are in direct contact with each other, and $N_4$ is a positive integer more than or equal to 2,
    wherein the forming the signal line comprises: performing $N_4$ patterning processes to respectively form the $N_4$ portions.

5. The manufacture method of the array substrate according to claim 4, wherein a total thickness of the signal line in the direction perpendicular to the base substrate is more than 5500 angstroms, and a thickness in the direction perpendicular to the base substrate of each portion of the $N_4$ portions is not more than 5500 angstroms.

6. The manufacture method of the array substrate according to claim 4, wherein the array substrate comprises a plurality of the signal lines extending in a same direction, and an interval between adjacent signal lines of the plurality of the signal lines is less than or equal to 6 μm.

7. The manufacture method of the array substrate according to claim 4, wherein a same mask is used to perform the $N_4$ patterning processes.

8. The manufacture method of the array substrate according to claim 4, wherein
    in a direction from a position close to the base substrate to a position away from the base substrate, the $N_4$ portions of the signal line are sequentially a first portion, a second portion . . . , and a $N_4$-th portion,
    a $M_4$-th portion of the signal line, a $M_1$-th portion of the gate electrode, a $M_2$-th portion of the first electrode, and a $M_3$-th portion of the second electrode are simultaneously formed by one patterning process using a same mask, and $M_1$ is a positive integer less than or equal to $N_1$, $M_2$ is a positive integer less than or equal to $N_2$, $M_3$ is a positive integer less than or equal to $N_3$, and $M_4$ is a positive integer less than or equal to $N_4$.

9. The manufacture method of the array substrate according to claim 4, wherein the signal line comprises at least one of a group consisting of a gate line electrically connected to the gate electrode, a data line electrically connected to the second electrode, a common voltage line providing a common voltage, and a ground line.

10. The manufacture method of the array substrate according to claim 9, wherein the data line intersects with and is insulated from the gate line and the manufacture method comprises:
forming the gate line, the gate electrode, the first electrode and the second electrode simultaneously by a same patterning process;
forming an interlayer insulating layer covering the gate line, the gate electrode, the first electrode and the second electrode, wherein the interlayer insulating layer comprises a via hole exposing the second electrode; and
forming the data line on the interlayer insulating layer, and the data line is electrically connected to the second electrode through the via hole.

11. The manufacture method of the array substrate according to claim 9, further comprising: forming a light shielding layer, wherein the light shielding layer is on a side, which is away from the gate electrode, of the semiconductor layer, and an orthographic projection of the light shielding layer on the base substrate at least partially overlaps an orthographic projection of a channel region of the semiconductor layer of the thin film transistor on the base substrate, wherein
the common voltage line or the ground line is electrically connected to the light shielding layer.

12. The manufacture method of the thin film transistor according to claim 1, wherein a total thickness of the N portions in the direction perpendicular to the base substrate is more than 5500 angstroms, and a thickness in the direction perpendicular to the base substrate of each portion of the N portions is not more than 5500 angstroms.

13. The manufacture method of the thin film transistor according to claim 1, wherein a same mask is used to perform the N patterning processes.

14. A manufacture method of a thin film transistor, comprising:
providing a base substrate; and
forming a gate electrode, a first electrode, a second electrode, and a semiconductor layer of the thin film transistor on the base substrate, wherein at least one of a group consisting of the gate electrode, the first electrode, and the second electrode comprises N portions that are stacked in a direction perpendicular to the base substrate, adjacent two portions of the N portions are in direct contact with each other, and N is a positive integer more than or equal to 2,
wherein the method comprises: performing N patterning processes to respectively form the N portions,
wherein the semiconductor layer comprises an upper surface away from the base substrate, a first side surface and a second side surface that intersect the upper surface, and the first side surface is opposite to the second side surface, and
the first electrode is in direct contact with the upper surface and the first side surface, and the second electrode is in direct contact with the upper surface and the second side surface.

15. The manufacture method of the thin film transistor according to claim 14, further comprising: forming a gate insulating layer, wherein the gate insulating layer comprises:
a first portion between the gate electrode and the semiconductor layer so as to insulate the gate electrode and the semiconductor layer, wherein the first portion exposes the upper surface, contacting with the first electrode and the second electrode, of the semiconductor layer, exposes the first side surface, contacting with the first electrode, of the semiconductor layer, and exposes the second side surface, contacting with the second electrode, of the semiconductor layer;
a second portion between the first electrode and the base substrate; and
a third portion between the second electrode and the base substrate.

16. The manufacture method of the thin film transistor according to claim 15, wherein the forming the gate insulating layer comprises:
forming a gate insulating material film;
forming a photoresist layer covering the gate insulating material film;
exposing and developing the photoresist layer using a two-tone mask to obtain a photoresist remaining region, a photoresist partially remaining region, and a photoresist removing region, wherein the photoresist remaining region is a region where the first portion of the gate insulating layer is to be formed, the photoresist partially remaining region is a region where the second portion and the third portion of the gate insulating layer are to be formed, and the photoresist removing region is a region except the photoresist remaining region and the photoresist partially remaining region;
performing a first etching process to remove a portion of the gate insulating material film in the photoresist removing region;
performing an ashing process to remove a portion of the photoresist layer in the photoresist partially remaining region and thin a portion of the photoresist layer in the photoresist remaining region;
performing a second etching process to thin a portion of the gate insulating material film in the photoresist partially remaining region, so as to form the first portion, the second portion, and the third portion of the gate insulating layer; and
removing a portion of the photoresist layer in the photoresist remaining region.

17. A thin film transistor, comprising: a gate electrode, a first electrode, a second electrode, and a semiconductor layer, wherein the gate electrode comprises $N_1$ portions that are stacked in a direction perpendicular to a base substrate, the first electrode comprises $N_2$ portions that are stacked in the direction perpendicular to the base substrate, and the second electrode comprises $N_3$ portions that are stacked in the direction perpendicular to the base substrate; $N_1$, $N_2$, and $N_3$ are all positive integers more than or equal to 2;
adjacent two portions of the $N_1$ portions are in direct contact with each other, adjacent two portions of the $N_2$ portions are in direct contact with each other, and adjacent two portions of the $N_3$ portions are in direct contact with each other;
in a direction from a position close to the base substrate to a position away from the base substrate, the $N_1$ portions are sequentially a first portion, a second portion . . . , and a $N_1$-th portion, the $N_2$ portions are sequentially a first portion, a second portion . . . , and a $N_2$-th portion, and the $N_3$ portions are sequentially a first portion, a second portion . . . , and a $N_3$-th portion; and
a $M_1$-th portion of the gate electrode, a $M_2$-th portion of the first electrode, and a $M_3$-th portion of the second electrode are in a same layer, wherein $M_1$ is a positive integer less than or equal to $N_1$, $M_2$ is a positive integer less than or equal to $N_2$, and $M_3$ is a positive integer less than or equal to $N_3$.

18. The thin film transistor according to claim 17, wherein the semiconductor layer comprises an upper surface, a first side surface and a second side surface that intersect the upper surface, and the first side surface is opposite to the second side surface, the first electrode is in direct contact with the upper surface and the first side surface, and the second electrode is in direct contact with the upper surface and the second side surface.

19. The thin film transistor according to claim 18, wherein the thin film transistor is on the base substrate and further comprises a gate insulating layer, and the gate insulating layer comprises:

a first portion between the gate electrode and the semiconductor layer so as to insulate the gate electrode and the semiconductor layer, wherein the first portion exposes the upper surface, contacting with the first electrode and the second electrode, of the semiconductor layer, exposes the first side surface, contacting with the first electrode, of the semiconductor layer, and exposes the second side surface, contacting with the second electrode, of the semiconductor layer;

a second portion between the first electrode and the base substrate; and a third portion between the second electrode and the base substrate.

* * * * *